(12) United States Patent
Park et al.

(10) Patent No.: US 10,770,637 B2
(45) Date of Patent: Sep. 8, 2020

(54) ENERGY HARVESTER

(71) Applicant: SAMSUNG ELECTRONICS CO., LTD., Suwon-si, Gyeonggi-do (KR)

(72) Inventors: Young-jun Park, Suwon-si (KR); Jin-hyoung Park, Suwon-si (KR); Yun-kwon Park, Dongducheon-si (KR); Ho-seong Seo, Suwon-si (KR); Sang-wook Kwon, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 298 days.

(21) Appl. No.: 15/518,641

(22) PCT Filed: Sep. 2, 2015

(86) PCT No.: PCT/KR2015/009222
§ 371 (c)(1),
(2) Date: Apr. 12, 2017

(87) PCT Pub. No.: WO2016/072606
PCT Pub. Date: May 12, 2016

(65) Prior Publication Data
US 2017/0236990 A1  Aug. 17, 2017

(30) Foreign Application Priority Data
Nov. 4, 2014  (KR) ........................ 10-2014-0152082

(51) Int. Cl.
*H01L 37/02* (2006.01)
*H02N 2/18* (2006.01)
(Continued)

(52) U.S. Cl.
CPC ............ *H01L 37/02* (2013.01); *H01L 41/113* (2013.01); *H02N 1/04* (2013.01); *H02N 2/18* (2013.01)

(58) Field of Classification Search
CPC ......... H01L 37/02; H01L 41/113; H02N 2/18; H02N 1/04
(Continued)

(56) References Cited

U.S. PATENT DOCUMENTS 7,175,339 B2   2/2007  Bisig
7,385,498 B2   6/2008  Dobosz
(Continued)

FOREIGN PATENT DOCUMENTS

CN   103780127   5/2014
CN   103795288   5/2014
(Continued)

OTHER PUBLICATIONS

Weiqing Yang et al: "3D Stack Intergrated Triboelectric Nanogenerator for Harvesting Vibration Energy", Advanced Functional Materials, vol. 24, No. 26, Jul. 9, 2014 (Jul. 9, 2014), pp. 4090-4096.
(Continued)

*Primary Examiner* — John K Kim
(74) *Attorney, Agent, or Firm* — Nixon & Vanderhye, P.C.

(57) ABSTRACT

An energy harvest is disclosed. The disclosed energy harvest includes: a first charging member including a plurality of first protruding parts; and a second charging member including a plurality of second protruding parts arranged between the first protruding parts and including a material different from that of the first protruding parts. When at least one of the first and second charging members moves, side surfaces of the first protruding parts and side surfaces of the second protruding parts come into contact with each other, or gaps between the side surfaces of the first protruding parts and the side surfaces of the second protruding parts are changed. The energy harvest generates electrical energy from the contact or the gap change.

7 Claims, 16 Drawing Sheets

(51) Int. Cl.
*H01L 41/113* (2006.01)
*H02N 1/04* (2006.01)

(58) Field of Classification Search
USPC .......................................................... 310/306
See application file for complete search history.

(56) References Cited

U.S. PATENT DOCUMENTS

| | | | |
|---|---|---|---|
| 8,536,760 | B1 | 9/2013 | Kim et al. |
| 8,803,401 | B2* | 8/2014 | Nakatsuka ............... H02N 1/08 310/300 |
| 8,975,864 | B2 | 3/2015 | Kim |
| 9,134,168 | B2* | 9/2015 | Masaki .................. G01H 11/06 |
| 9,306,633 | B2 | 4/2016 | Choi et al. |
| 9,748,869 | B2* | 8/2017 | Ikuta ........................ H02N 1/10 |
| 9,837,933 | B2* | 12/2017 | Park ...................... H01L 41/113 |
| 10,103,648 | B2* | 10/2018 | Park ........................ H02N 1/04 |
| 2010/0045241 | A1 | 2/2010 | Nousiainen |
| 2012/0007470 | A1* | 1/2012 | Kurihara ............ H01L 41/1136 310/329 |
| 2013/0214611 | A1 | 8/2013 | Bae |
| 2013/0221802 | A1 | 8/2013 | Oh |
| 2013/0307473 | A1 | 11/2013 | Han et al. |
| 2013/0321983 | A1 | 12/2013 | Chung et al. |
| 2014/0028569 | A1* | 1/2014 | Guard ..................... G06F 3/044 345/173 |
| 2014/0056043 | A1* | 2/2014 | Naito ...................... H02N 1/08 363/84 |
| 2014/0077613 | A1 | 3/2014 | Song et al. |
| 2015/0061464 | A1* | 3/2015 | Park ...................... H01L 41/113 310/329 |
| 2015/0194911 | A1 | 7/2015 | Kim et al. |
| 2015/0236551 | A1 | 8/2015 | Shearer et al. |
| 2015/0333661 | A1* | 11/2015 | Ikuta ........................ H02N 1/06 310/300 |
| 2017/0236990 | A1* | 8/2017 | Park ........................ H02N 1/04 310/306 |

FOREIGN PATENT DOCUMENTS

| | | |
|---|---|---|
| EP | 2 940 854 | 11/2015 |
| JP | 2007-143353 | 6/2007 |
| JP | 5063816 | 10/2012 |
| JP | 2013-085437 | 5/2013 |
| JP | 2013-118784 | 6/2013 |
| JP | 2014-131418 | 7/2014 |
| KR | 10-2008-0017460 | 2/2008 |
| KR | 10-0920012 | 9/2009 |
| KR | 10-2012-0058414 | 6/2012 |
| KR | 10-2012-0078995 | 7/2012 |
| KR | 10-1199004 | 11/2012 |
| KR | 10-2013-0045306 | 5/2013 |
| KR | 10-1298223 | 8/2013 |
| KR | 10-2013-0096827 | 9/2013 |
| KR | 10-2013-0128565 | 11/2013 |
| KR | 10-1398708 | 5/2014 |
| KR | 10-2014-0105333 | 9/2014 |
| WO | 2013/136691 | 9/2013 |
| WO | 2014/103762 | 7/2014 |

OTHER PUBLICATIONS

Partial Supplementary European Search Report dated Oct. 26, 2017 for EP Application No. 15856548.1.
Zhu, G. et al.,"Toward Large-Scale Energy Harvesting by a Nanoparticle-Enhanced Triboelectric Nanogenerator," American Chemical Society, Jan. 29, 2013, 4 pages.
Du, W et al., "A Three Dimensional Multi-Layered Sliding Triboelectric Nanogenerator," Advanced Energy Materials, Apr. 9, 2014, 6 pages.
Search Report and Written Opinion dated Jan. 22, 2017 in counterpart International Patent Application No. PCT/KR2015/009222.
Office Action dated Mar. 17, 2017 in counterpart Korean Patent Application No. 10-2014-0152082.
Notice of Allowance dated May 4, 2017 in counterpart Korean Patent Application No. 10-2014-0152082.
Office Action dated Aug. 3, 2018 in counterpart Chinese Patent Application No. 201580059778.2.
Yang, Weiqing, et al, "3D Stack Integrated Triboelectric Nanogenerator for Harvesting Vibration Energy," Advanced Functional Materials 2014, issue 26, vol. 24, pp. 4090-4096.
Wang, Sihong et al., "Nanoscale Triboelectric-Effect-Enabled Energy Conversion for Sustainably Powering Portable Electronics," Nano Letters 2012, No. 12, Nov. 6, 2012, pp. 6339-6346.
Yang, Ya et al., "Fully Enclosed Triboelectric Nanogenerators for Applications in Water and Harsh Environments, Advanced Energy Materials," No. 3, Jul. 16, 2013, pp. 1563-1568.
First Office Action dated Jan. 21, 2019 in counterpart Korean Patent Application No. 10-2016-0177885 and English-language translation.
Second Office Action dated Mar. 21, 2019 in counterpart Chinese Patent Application No. 201580059778.2 and English-language translation.
Notice of Final Rejection dated Jul. 26, 2019 in Korean Patent Application No. 10-2016-0177885 and English-language machine translation thereof.
Communication pursuant to Article 94(3) EPC dated Apr. 7, 2020 in European Patent Application No. 15856548.1.
Yagnamurthy, Sivakumar et al., "Mechanical and Ferroelectric Behavior of PZT-Based Thin Films," Journal of Microelectromechanical Systems, IEEE Service Center, vol. 20, No. 6, Dec. 1, 2011, pp. 1250-1258.

* cited by examiner

ENERGY HARVESTER

This application is the U.S. national phase of International Application No. PCT/KR2015/009222 filed 2 Sep. 2015, which designated the U.S. and claims priority to KR Patent Application No. 10-2014-0152082 filed 4 Nov. 2014, the entire contents of each of which are hereby incorporated by reference.

TECHNICAL FIELD

Embodiments relate to an energy harvester and to an energy harvester for generating electrical energy by mutual contact of or changes of gap between charging members.

BACKGROUND ART

Along with the recent rapid increase in the use of smartphones, various attempts have been made to develop a mutual control method between a smartphone and a peripheral device. In particular, research into a smart watch in which a smartphone and a watch are combined has been actively conducted, and some prototypes have been commercialized. A smart watch is used to control or monitor functions of a smartphone, such as calling, messaging, and usage of an application. The smart watch consumes more power than a general wrist watch, and thus there is a problem in that the smart watch should be frequently charged or have a large-capacity battery to continuously supply power thereto.

DETAILED DESCRIPTION OF THE INVENTION

Technical Problem

At least one embodiment provides an energy harvester for generating electrical energy.

Technical Solution

According to an aspect of an embodiment, an energy harvester includes: a first charging member including a plurality of first protruding parts; and a second charging member including a plurality of second protruding parts arranged between the first protruding parts and including a material different from that of the first protruding parts, wherein, when at least one of the first charging member and the second charging member moves, side surfaces of the first protruding parts and side surfaces of the second protruding parts come into contact with each other, or gaps between the side surfaces of the first protruding parts and the side surfaces of the second protruding parts are changed, thereby generating electrical energy.

Advantageous Effects of the Invention

According to embodiments, when an external force is applied to an energy harvester, charging members may be in contact with each other, or a gap between the charging members may be changed, thereby generating electrical energy. Accordingly, kinetic energy may be effectively converted into electrical energy. In addition, by equipping the energy harvester in a portable device, energy may be continuously provided to the portable device by charging.

BEST MODE

Figure 1:
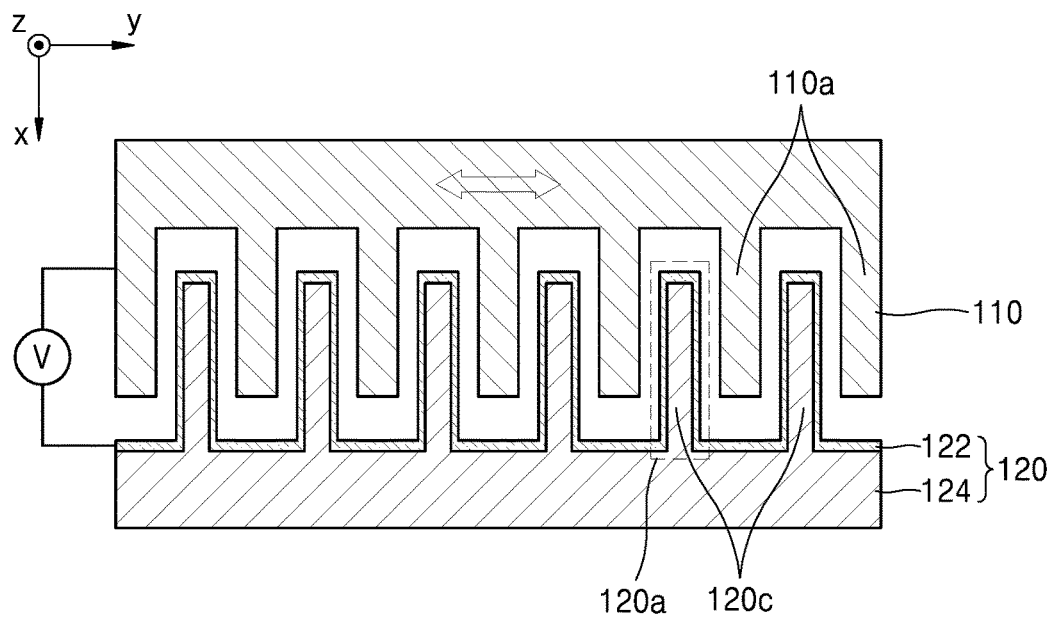
FIG. 1 is a cross-sectional view of an energy harvester according to an example embodiment.

According to an aspect of an embodiment, an energy harvester includes: a first charging member including a plurality of first protruding parts; and a second charging member including a plurality of second protruding parts arranged between the first protruding parts and including a material different from that of the first protruding parts, wherein, when at least one of the first and second charging members moves, side surfaces of the first protruding parts and side surfaces of the second protruding parts contact with each other, or gaps between the side surfaces of the first protruding parts and the side surfaces of the second protruding parts are changed, thereby generating electrical energy.

The first and second protruding parts may be formed in a first direction, and at least one of the first and second charging members may move in a second direction orthogonal to the first direction.

The first charging member may include a first electrode including the first protruding parts.

The first charging member may include: a first plastic structure including a plurality of first posts having a shape corresponding to the first protruding parts; and the first electrode provided on a surface of the first plastic structure.

The second charging member may include: a second electrode including a plurality of second posts having a shape corresponding to the second protruding parts; and a dielectric layer provided on surfaces of the second posts.

The dielectric layer may include at least one of piezoelectric materials, ferroelectric materials, an electroactive polymer (EAP), and pyroelectric materials.

The second charging member may include: a second electrode; and a dielectric layer provided on the second electrode and including the second protruding parts.

The second electrode may include: a plurality of first sub-electrodes arranged in parallel to an arrangement direction of the first and second protruding parts and electrically connected to each other; and a plurality of second sub-electrodes arranged between the first sub-electrodes and electrically connected to each other.

The second charging member may include: a second plastic structure including a plurality of second posts having a shape corresponding to the second protruding parts; a second electrode provided on the second plastic structure; and a dielectric layer provided on the second electrode.

The first and second charging members may include charging materials different from each other.

The first charging member may include: a first electrode; and a first dielectric layer provided on the first electrode.

The second charging member may include: a second electrode; and a second dielectric layer provided on the second electrode.

The second electrode may include: a plurality of first sub-electrodes arranged in parallel to an arrangement direction of the first and second protruding parts and electrically connected to each other; and a plurality of second sub-electrodes arranged between the first sub-electrodes and electrically connected to each other.

The first and second protruding parts may have a striped form in which a plurality of lines are formed in parallel to each other.

At least one of the first and second protruding parts may be surface-treated so as to increase a surface area thereof.

The energy harvester may further include a first case configured to contain the first and second charging members therein.

The energy harvester may further include a first elastic supporter provided inside the first case to restore a position of at least one of the first and second charging members when at least one of the first and second charging members moves.

The energy harvester may further include a third charging member provided on an inner wall of the first case to generate electrical energy by mutual contact with at least one of the first and second charging members or a change in a gap between the third charging member and the at least one of the first and second charging members.

The energy harvester may further include: a second case configured to contain the first case therein; and a second elastic body provided inside the second case to restore a position of the first case when the first case moves inside the second case.

The energy harvester may further include a first guide member configured to guide at least one of the first and second charging members to move in a first direction.

The energy harvester may further include a second guide member configured to guide at least one of the first and second charging members to move in a second direction orthogonal to the first direction.

The energy harvester may further include: a case configured to contain the first and second charging members and the first and second guide members therein; and a third charging member provided on an inner wall of the case to generate electrical energy by mutual contact with at least one of the first and second charging members or a change in a gap between the third charging member and the at least one of the first and second charging members.

According to an aspect of another embodiment, an energy harvester includes: a first charging member; a second charging member including a first charging material charging material layer having a plurality of protruding parts on a surface thereof and including a material different from that of the first charging member, and a second charging material layer including a material different from that of the first charging material layer; a first electrode provided on another surface of the first charging material layer; and a second electrode provided on the other surface of the first charging material layer, wherein, when at least one of the first and second charging members moves, electrical energy is generated from the first and second electrodes.

The first electrode may include a plurality of first sub-electrodes provided in a direction in which the protruding parts are arranged, the plurality of first sub-electrodes electrically connected to each other, and the second electrode may include a plurality of second sub-electrodes provided between the first sub-electrodes and electrically connected to each other.

According to an aspect of another embodiment, an energy harvester includes: a first charging member; and a second charging member spaced apart from the first charging member, surrounding the first charging member, and including a material different from that of the first charging member, wherein, when at least one of the first and second charging members moves, an outer surface of the first charging member and an inner surface of the second charging member come into contact with each other, or a gap between the outer surface of the first charging member and the inner surface of the second charging member is changed, thereby generating electrical energy.

The first charging member may have a disc shape, and the second charging member may have a ring shape.

The first charging member may have a spherical shape, and the second charging member may have a spherical shape surrounding the first charging member.

The first charging member may include a first electrode, and the second charging member may include a second electrode and a dielectric layer provided inside the second electrode.

The first charging member may include a first electrode and a first dielectric layer provided outside the first electrode, and the second charging member may include a second electrode and a second dielectric layer provided inside the second electrode.

The energy harvester may further include an elastic supporter provided between the first charging member and the second charging member to apply a restoring force to at least one of the first charging member and the second charging member.

According to an aspect of another embodiment, an energy harvester includes: a first charging member including a first electrode; and a second charging member provided so as to face the first charging member and including a second electrode and a plurality of dielectric layers arranged in a radial shape on the second electrode, wherein electrical energy is generated by a relative rotary motion between the first charging member and the second charging member.

The first charging member may have a smaller area than the second charging member.

A first friction layer may have a disc shape, and a second friction layer may have a semi-disc shape.

The energy harvester may further include an elastic body configured to apply a restoring force to at least one of the first and second charging members.

According to an aspect of another embodiment, a smart watch includes: the energy harvester; and a transmission circuit configured to transmit electrical energy generated by the energy harvester to another element.

The transmission circuit may include: a converter configured to convert an alternating current (AC) signal into a direct current (DC); a control unit configured to control an impedance of the transmission circuit such that a transmission rate of power delivered by the transmission circuit is maximized; and a step down converter configured to adjust a magnitude of a DC voltage converted by the converter.

MODE OF THE INVENTION

Hereinafter, embodiments will be described in detail with reference to the accompanying drawings. Like reference numerals in the drawings denote like elements, and sizes or thicknesses of components may be exaggerated for clarity of description. In addition, when it is described that a certain material layer exists on a substrate or another layer, the material layer may exists on the substrate or another layer directly or via a third layer. In addition, a material forming each layer in the embodiments below is illustrative, and thus, other materials may be used instead.

FIG. 1 is a cross-sectional view of an energy harvester according to an example embodiment.

Referring to FIG. 1, the energy harvester according to an embodiment may include a first charging member 110 including a plurality of first protruding parts 110a, and a second charging member 120 including a plurality of second protruding parts 120a arranged between the first protruding parts 110a and including a material different from that of the first protruding parts 110a. According to the embodiment shown in FIG. 1, the first and second charging members 110 and 120 may each be in the form of plates on which the plurality of first and second protruding parts 110a and 120a are provided. As shown in FIG. 1, the plurality of first and second protruding parts 110a and 120a may be provided in a direction (x-axis) orthogonal to the plates. This is only illustrative, and the first and second protruding parts 110a and 120a may be formed in a direction inclined relative to the x-axis.

Side surfaces of the first protruding parts 110a and side surfaces of the second protruding parts 120a may be in contact with each other, or gaps between the side surfaces of the first protruding parts 110a and side surfaces of the second protruding parts 120a may be changed. In this case, triboelectrification may occur, thereby generating electrical energy. The triboelectrification may occur not only when the first and second protruding parts 110a and 120a are in contact with each other but also when only a distance between the first and second protruding parts 110a and 120a is changed without contact. For example, when at least one of the first and second protruding parts 110a and 120a includes a normally electrified material such as a ferroelectric material or an electroactive polymer on a surface thereof, electrical energy may be generated even when a gap between the first and second protruding parts 110a and 120a is changed without contact of the first and second protruding parts 110a and 120a.

At least one of the first and second charging members 110 and 120 may be configured to be movable in a second direction (y-direction) orthogonal to a first direction (x-direction) such that the first and second protruding parts 110a and 120a are in contact with each other or a gap between the first and second protruding parts 110a and 120a is changed. In this case, the first charging member 110 may be fixed, and only the second charging member 120 may move in the second direction (y-axis) with regard to the first charging member 110. On the contrary, the second charging member 120 may be fixed, and only the first charging member 110 may move in the second direction (y-axis). Alternatively, both the first and second charging members 110 and 120 may move in the second direction (y-axis). Herein, the meaning of movable in the second direction (y-axis) is not necessarily limited to moving in parallel to the second direction (y-axis) and is sufficiently satisfied when a second direction (y-axis) component is included in a moving direction component. For example, at least one of the first and second charging members 110 and 120 may move in the second direction (y-axis) and simultaneously move in the first direction (x-axis) or a direction (z-axis) orthogonal to both the first and second directions (x- and y-axes).

The first and second protruding parts 110a and 120a may be in the form of lines having a length in the direction (z-axis direction orthogonal to the ground) orthogonal to the first and second directions (x- and y-axes). Since each of the first and second protruding parts 110a and 120a has a line form, the plurality of first and second protruding parts 110a and 120a may have striped forms in which a plurality of lines are arranged in parallel to each other. This is only illustrative and is not limited thereto. For example, the first and second protruding parts 110a and 120a may be two-dimensionally arranged instead of being arranged in the striped forms. For efficient triboelectrification, the first and second charging members 110, the first and second protruding parts 110a and 120a may be provided with a predetermined width and at a predetermined interval. By doing this, when at least one of the first and second charging members 110 and 120 moves in the second direction (y-axis), the first and second protruding parts 110a and 120a may be in contact with each other at the same time, or the same gaps between the first and second protruding parts 110a and 120a may be changed. However, the first and second protruding parts 110a and 120a do not have to have a predetermined width and interval, and the first and second protruding parts 110a and 120a may be irregularly arranged.

The first and second charging members 110 and 120 may respectively include materials having different charging rates on surfaces thereof to generate electrical energy by the triboelectrification described above. For example, according to the embodiment shown in FIG. 1, the first charging member 110 may include a first electrode including the first protruding parts 110a. In this case, the first electrode may include a conductive material. As shown in FIG. 1, when the first charging member 110 includes only the first electrode, the first electrode may act as an electrode and simultaneously cause triboelectrification to occur. The second charging member 120 may include a second electrode 124 including a plurality of second posts 120c having a shape corresponding to the second protruding parts 120a, and a dielectric layer 122 provided on surfaces of the second posts 120c. In the second charging member 120, the dielectric layer 122 may cause triboelectrification to occur, and the second electrode 124 may act as an electrode. The dielectric layer 122 may be formed on a surface of the second charging member 120. The second posts 120c may be formed on the electrode 124 and the dielectric layer 122 may be coated on surfaces of the second posts 120c to form the second protruding parts 120a. As shown in FIG. 1, when the dielectric layer 122 is thinly formed on the surface of the second electrode 124, charged charges generated in the dielectric layer 122 may more easily reach the second electrode 124.

The dielectric layer 122 may include various materials. The dielectric layer 122 may include at least one of piezoelectric materials, ferroelectric materials, an electroactive polymer (EAP), and pyroelectric materials, but is not limited thereto. As an example of the materials, first and second dielectrics may include polyformaldehyde, ethylcellulose, polyamide, wool, silk, paper, cotton, steel, wood, polyvinyl alcohol (PVA), silicone rubber, Teflon, polydimethylsiloxane (PDMS), Kapton, polypropylene, polyethylene, polyvinyl chloride (PVC), fluorine polymer (e.g., polyvinylfluoride; PVF), polyvinylidene fluoride (PVDF), polytetrafluoroethylene (PTFE), polychlorotrifluoroethylene (PCTFE), perfluoroalkoxy (PFA) polymer, fluorinated ethylene-propylene (FEP), polyethylene tetrafluoroethylene (ETFE), polypropylene (PP), polyethylene terephthalate (PET), quartz, lead zirconium titanate (PZT), ZnO, barium tin oxide (BTO), and the like, but are also not limited thereto. The dielectric layer 122 may be prepared by at least one method of surface treatment, ferroelectric nanoparticle insertion, and a method of controlling a property of matter by heterogeneous polymer stacking.

The conductive material included in the first electrode of the first charging member 110 may include at least one of a metal, graphene, carbon nanotubes (CNTs), indium tin oxide (ITO), and a conductive polymer, but is not limited thereto. Examples of the metal may include at least one of aluminum (Al), magnesium (Mg), copper (Cu), lead (Pb), iron (Fe), nickel (Ni), silver (Ag), platinum (Pt), gold (Au), and an alloy thereof, and the conductive polymer may include, for example, [6,6]-phenyl-C85 butyric acid methyl ester (PCBM). However, the materials described above are only illustrative, and the present embodiment is not limited thereto. The conductive material included in the first electrode may also be included in the second electrode 124 of the second charging member 120.

When triboelectrification occurs between the first and second charging members 110 and 120, if a surface area of a surface on which the triboelectrification occurs is larger, more electrical energy may be generated. Therefore, surfaces of the first and second charging members 110 and 120 on which the triboelectrification occurs may be surface-treated so as to increase surface areas thereof. That is, according to the embodiment shown in FIG. 1, a surface of the first charging member 110 including the conductive material and a surface of the dielectric layer 122 on a surface of the second charging member 120 may be surface-treated so as to increase surface areas thereof.

Figure 2:
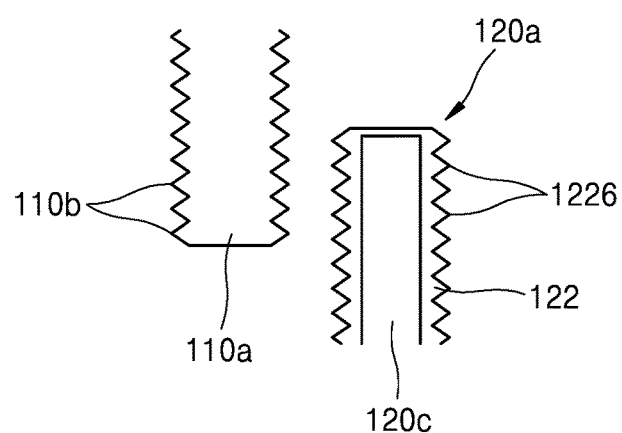
FIG. 2 illustrates a surface of a first protruding part and a surface of a dielectric in a second protruding part, the surfaces having been surface-treated so as to increase a surface area thereof.
Figure 3:
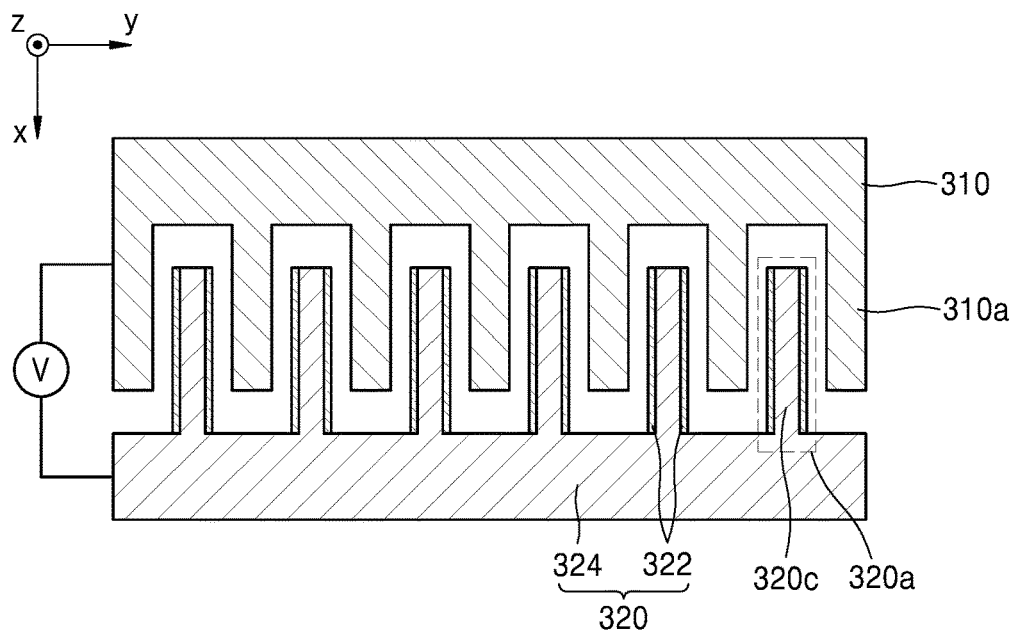
FIGS. 3 through 14 are cross-sectional views of energy harvesters according to other example embodiments.

FIG. 2 illustrates that the dielectric layer 122 on a surface of the first protruding part 110a and the dielectric layer 122 on a surface of the second post 120c have been surface-treated so as to increase surface areas thereof. Referring to FIG. 2, by the surface treatment, fine protruding parts 110b may be formed on the first protruding part 110a, and fine protruding parts 120b may also be formed on the dielectric layer 122 of the second protruding part 120a. Although FIG. 2 shows an example in which surfaces of both the first and second protruding parts 110a and 120a are surface-treated, the present embodiment is not limited thereto, and only one of the first and second protruding parts 110a and 120a may be surface-treated. In addition, although FIG. 3 shows an example in which the fine protruding parts formed on the surfaces of the first and second protruding parts 110a and 120a have a nanopyramid form, the present embodiment is not limited thereto. For example, the fine protruding parts 110b and 120b may have a nanowire form, a fibrous form, a nanoparticle form, a nanorod form, or the like. Herein, the fine protruding parts may have a size of about 1 nm to about 1 mm but are not limited thereto. A material different from that of the fine protruding parts may be filled in between the fine protruding parts shown in FIG. 2.

FIG. 3 is a cross-sectional view of an energy harvester according to another example embodiment.

Referring to FIG. 3, the energy harvester according to another example embodiment may include first and second charging members 310 and 320 like those of the embodiment shown in FIG. 1. In addition, the first and second charging members may respectively include a plurality of first and second protruding parts 310a and 320a. In the embodiment shown in FIG. 3, the first charging member 310 may include a first electrode. The first electrode may include a conductive material. In addition, the second charging member 320 may include a dielectric layer 322 and a second electrode 324.

The dielectric layer 322 may include various materials. The dielectric layer 122 may include at least one of piezoelectric materials, ferroelectric materials, an EAP, and pyroelectric materials, but is not limited thereto. The dielectric layer 322 may be prepared by at least one of a surface treatment method, a ferroelectric nanoparticle insertion method, and a method of controlling a property of matter by heterogeneous polymer stacking. The conductive material included in the first electrode may include at least one of a metal, graphene, CNTs, ITO, and a conductive polymer, but is not limited thereto. Examples of the metal may include at least one of Al, Mg, Cu, Pb, Fe, Ni, Ag, Pt, Au, and an alloy thereof, and the conductive polymer may include, for example, PCBM. However, the materials described above are only illustrative, and the present embodiment is not limited thereto. The conductive material included in the first electrode may also be included in the second electrode 324 of the second charging member 320.

Unlike FIG. 1, in the embodiment shown in FIG. 3, the dielectric layer 322 may be formed only on a part of a surface of the second electrode 324 instead of being formed over a whole surface of the second electrode 324. For example, as shown in FIG. 3, the dielectric layer 322 may be formed on side surfaces of a second post 320c. In this case, the side surfaces of the second post 320c may indicate surfaces parallel to a direction (x-axis) in which a second protruding part 320c is formed in the second post 320c. In addition, although FIG. 3 shows an example in which the dielectric layer 322 is formed only on the side surfaces of the second post 320c, the present embodiment is not necessarily limited thereto. For example, the dielectric layer 322 may also be formed on a top surface of the second post 320c. In addition, in the embodiment shown in FIG. 3, the surface treatment process described with reference to FIG. 2 may also be performed.

Figure 4:
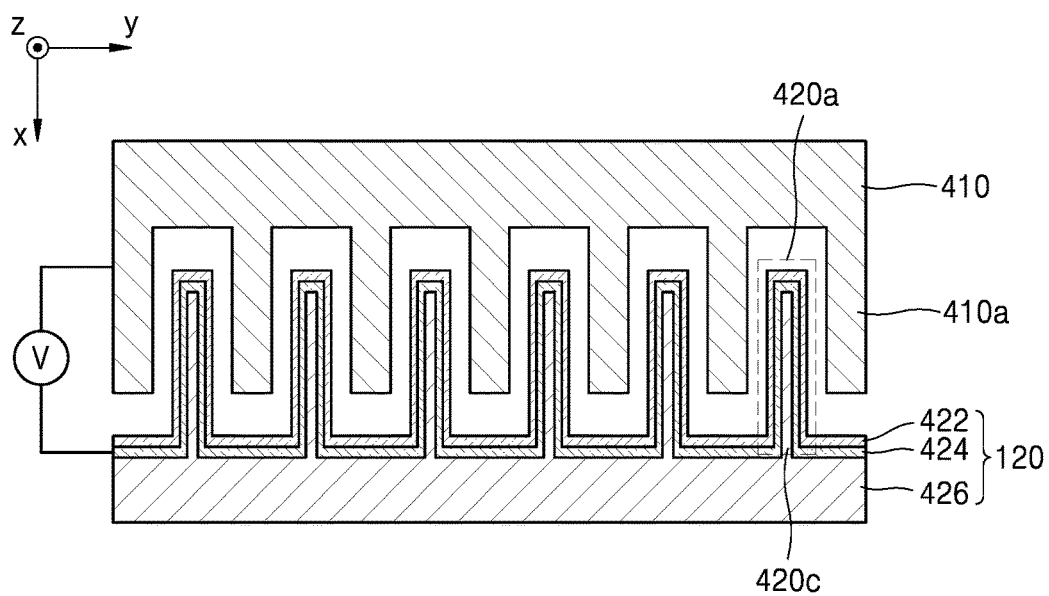

FIG. 4 is a cross-sectional view of an energy harvester according to another example embodiment.

In the description of the embodiment of FIG. 4, repeated descriptions are omitted. Referring to FIG. 4, the energy harvester may include first and second charging members 410 and 420. In addition, the first and second charging members 410 and 420 may include a plurality of first and second protruding parts 410a and 420a, respectively. The first charging member 410 may include a first electrode including a conductive material. The first electrode may cause triboelectrification to occur and simultaneously act as an electrode. The second charging member 420 may include a dielectric layer 422, a second electrode 424, and a polymer structure 426. The polymer structure may include plastic or the like. In this case, the polymer structure 426 may include a plurality of second posts 420c having a shape corresponding to the second protruding parts 420a. In addition, the dielectric layer 422 and the second electrode 424 may be formed on a surface of the polymer structure 426. Therefore, the dielectric layer 422 and the second electrode 424 may be provided on surfaces of the second posts 420c. As shown in FIG. 4, when the dielectric layer 322 making triboelectrification occur and the second electrode 424 acting as an electrode are thinly formed on the polymer structure 426, a total weight of the second charging member 420 may be reduced.

Figure 5:
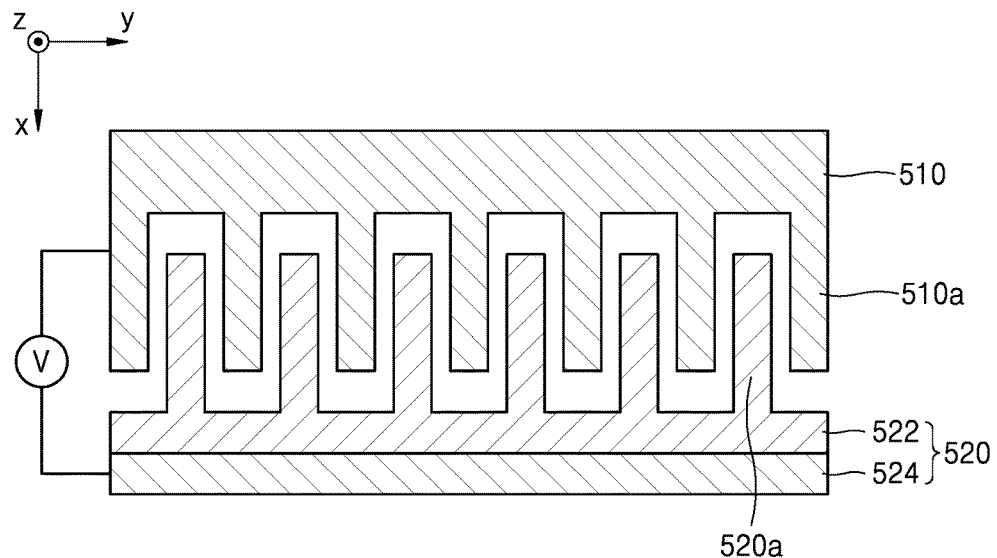

FIG. 5 is a cross-sectional view of an energy harvester according to another example embodiment.

In the description of the embodiment of FIG. 5, repeated descriptions are omitted. Referring to FIG. 4, the energy harvester may include first and second charging members 510 and 520. The first and second charging members 510 and 520 may respectively include a plurality of first and second protruding parts 510*a* and 520*a*. The first charging member 510 may include a first electrode including a conductive material. The first electrode may cause triboelectrification to occur and simultaneously act as an electrode. The second charging member 520 may include a dielectric layer 522 and a second electrode 524. Unlike the embodiments of FIGS. 1, 3, and 4, in FIG. 5, the dielectric layer 522 may include a plurality of second protruding parts 520*a*. In addition, the second electrode 524 may be provided below the dielectric layer 522.

Figure 6:
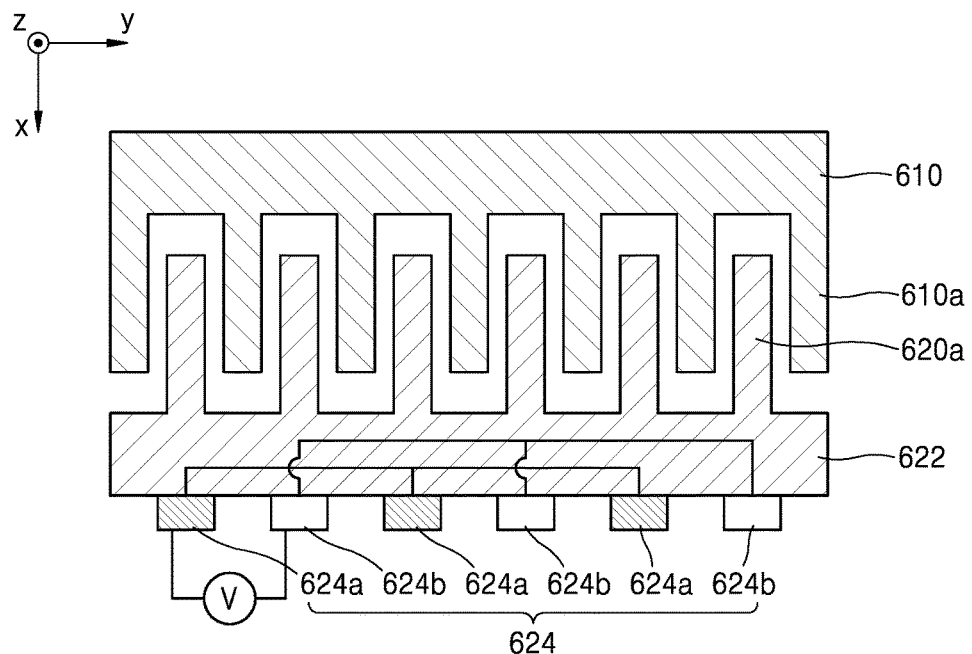

FIG. 6 is a cross-sectional view of an energy harvester according to another example embodiment.

In the description of the embodiment of FIG. 6, repeated descriptions are omitted. Referring to FIG. 6, the energy harvester may include first and second charging members 610 and 620. In addition, the first and second charging members 610 and 620 may respectively include a plurality of first and second protruding parts 610*a* and 620*a*. The first charging member 610 may include a first electrode including a conductive material. The first electrode may cause triboelectrification to occur and simultaneously act as an electrode. The second charging member 620 may include a dielectric layer 622 and a second electrode 624. Like FIG. 5, the dielectric layer 622 of the second charging member 620 may include a plurality of second protruding parts 620*a*. In addition, the second electrode 624 may be provided below the dielectric layer 622. Although the second electrode 524 in FIG. 5 is a single electrode, the second electrode 624 in FIG. 6 may include at least two sub-electrodes. For example, the second electrode 624 may include a plurality of first sub-electrodes 624*a* arranged parallel to an arrangement direction of the first and second protruding parts 610*a* and 620*a* and electrically connected to each other. In addition, the second electrode 624 may include a plurality of second sub-electrodes 624*a* arranged parallel to the arrangement direction of the first and second protruding parts 610*a* and 620*a* and electrically connected to each other. In this case, the first and second sub-electrodes 624*a* and 624*b* may be electrically isolated from each other.

In FIG. 6, the first sub-electrodes 624*a* are arranged in an odd-numbered order, and the second sub-electrodes 624*b* are arranged in an even-numbered order. However, this arrangement order of the first and second sub-electrodes 624*a* and 624*b* is not necessarily limited thereto and may be changed. Since the first sub-electrodes 624*a* are electrically connected to each other, the first sub-electrodes 624*a* may have the same potential. In addition, since the second sub-electrodes 624*b* are also electrically connected to each other, the second sub-electrodes 624*b* may have the same potential. However, since the first sub-electrodes 624*a* are electrically isolated from the second sub-electrodes 624*b*, the first sub-electrodes 624*a* may have a potential different from that of the second sub-electrodes 624*b*. Therefore, when triboelectrification occurs between the first and second charging members 610 and 620, a potential difference may occur between the first sub-electrodes 624*a* and the second sub-electrodes 624*b*. In addition, electrical energy may be generated from the potential difference.

Figure 7:
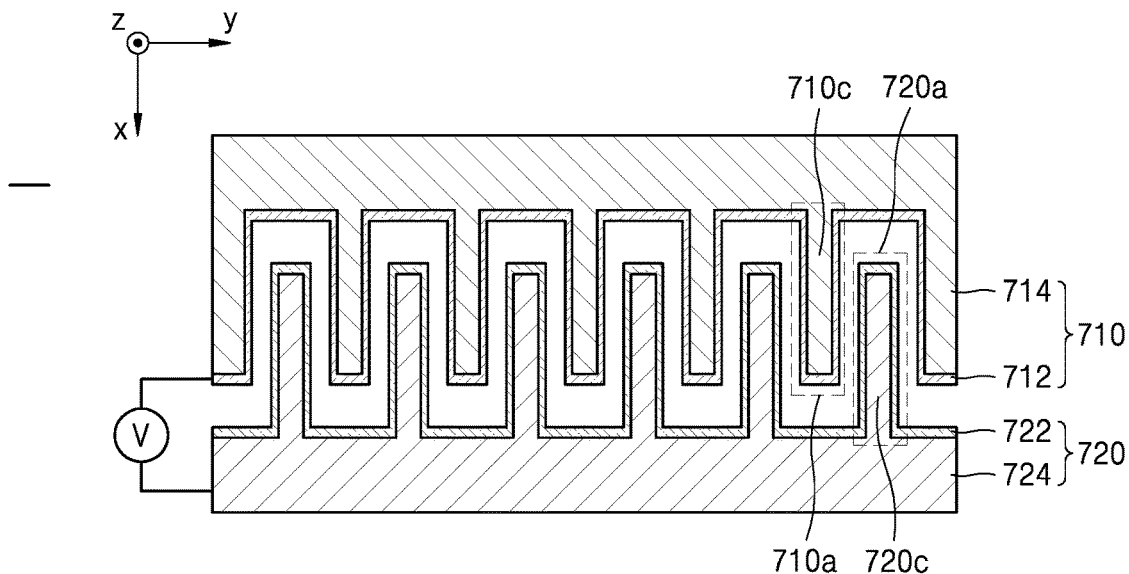

FIG. 7 is a cross-sectional view of an energy harvester according to another example embodiment.

In the description of the embodiment of FIG. 7 is described, repeated descriptions are omitted. Referring to FIG. 7, the energy harvester may include first and second charging members 710 and 720. In addition, the first and second charging members 710 and 720 may respectively include a plurality of first and second protruding parts 710*a* and 720*a*. The second charging member 720 may include a dielectric 722 and an electrode 724. The second charging member 120 shown in FIG. 1 is applied as an example to the second charging member 720, but the present embodiment is not limited thereto, and all the embodiments of the second charging members 120, 320, 420, 520, and 620 shown in FIGS. 1 through 6 may be applied thereto. The first charging member 710 may include a first plastic structure 714 including a plurality of first posts 710*c* having a shape corresponding to the first protruding parts 710*a* and a first electrode 712 provided on a surface of the first plastic structure 714. The first electrode 712 may include a conductive material. The first electrode 712 may cause triboelectrification to occur and simultaneously act as an electrode. The polymer structure 714 may have the first posts 710*c*. By forming the first electrode 712 on the surface of the polymer structure 714, a weight of the first charging member 710 may be reduced.

Examples in which electrical energy is generated by triboelectrification between a conductive material of a first charging member and a dielectric of a second charging member have been described.

Hereinafter, examples in which electrical energy is generated by triboelectrification at an interface between dielectrics are described.

Figure 8:
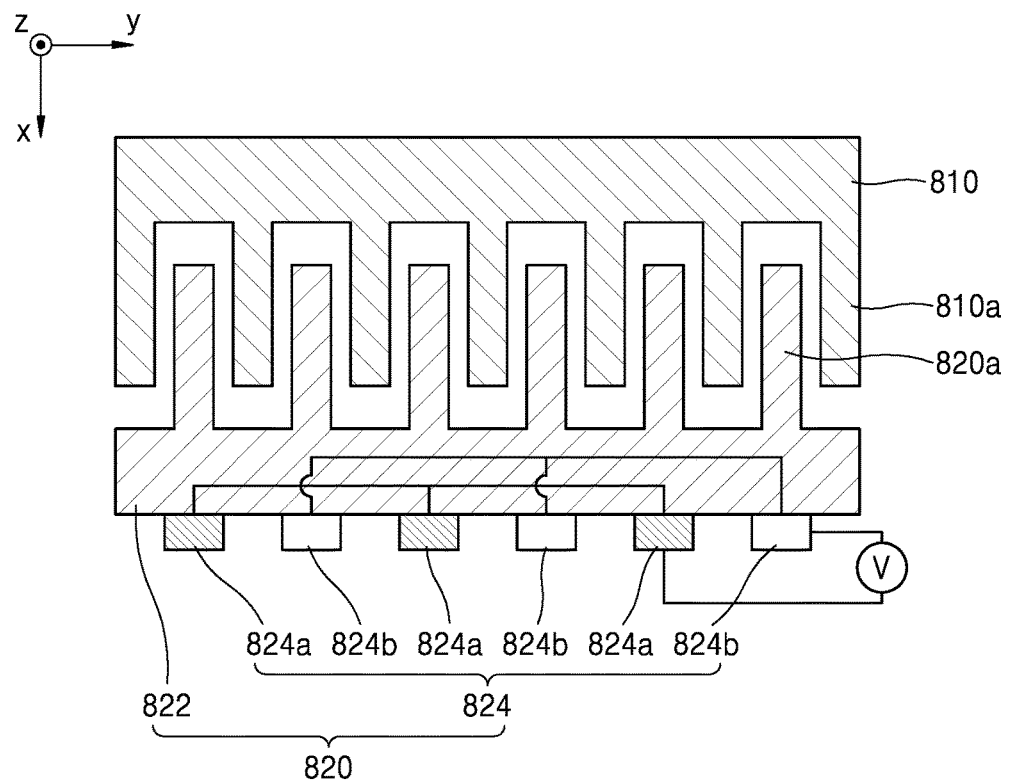

FIG. 8 is a cross-sectional view of an energy harvester according to another example embodiment.

Referring to FIG. 8, the energy harvester may include first and second charging members 810 and 820. In addition, the first and second charging members 810 and 820 may respectively include a plurality of first and second protruding parts 810*a* and 820*a*. The first and second charging members 810 and 820 may include different dielectrics on surfaces thereof. For example, the first charging member 810 may include a first dielectric layer, and the second charging member 820 may include a second dielectric layer 822 including a second dielectric. In addition, the second charging member 820 may include an electrode 824. The electrode 824 may be provided below the second dielectric layer 822. Like FIG. 7, the electrode 824 shown in FIG. 8 may include a plurality of first sub-electrodes 824*a* arranged parallel to an arrangement direction of the first and second protruding parts 810*a* and 820*a* and electrically connected to each other. In addition, the electrode 824 may include a plurality of second sub-electrodes 824*b* arranged parallel to the arrangement direction of the first and second protruding parts 810*a* and 820*a* and electrically connected to each other. The first and second sub-electrodes 824*a* and 824*b* may be electrically isolated from each other. In FIG. 8, the first sub-electrodes 824*a* are arranged in an odd-numbered order, and the second sub-electrodes 824*b* are arranged in an even-numbered order. However, this arrangement order of the first and second sub-electrodes 824*a* and 824*b* is only illustrative and may be changed. As described above with reference to FIG. 6, since electrical energy can be generated by using a potential difference between the first and second sub-electrodes 824*a* and 824*b*, the first charging member 810 does not have to separately include a conductive material. Therefore, the first charging member 810 may include only the first dielectric layer for causing triboelectrification to occur, but is not limited thereto.

The first dielectric layer included in the first charging member 810 and the second dielectric layer 822 of the second charging member 820 may include materials having different triboelectric series so as to generate electrical energy by triboelectrification. The first and second dielectric layers may include at least one of piezoelectric materials, ferroelectric materials, an EAP, and pyroelectric materials. For example, first and second dielectrics may include polyformaldehyde, ethylcellulose, polyamide, wool, silk, paper, cotton, steel, wood, PVA, silicone rubber, Teflon, PDMS, Kapton, polypropylene, polyethylene, PVC, fluorine polymer (e.g., PVF), PVDF, PTFE, PCTFE, PFA polymer, FEP, ETFE, PP, PET, quartz, PZT, ZnO, BTO, and the like, but are not limited thereto.

Materials forming the first and second dielectric layers for triboelectrification may be determined in consideration of a triboelectric series and a work function. For example, when the work function is considered, the first and second dielectric layers may include materials having a low work function. In addition, when the triboelectric series is considered, any one of the first and second dielectric layers may include a material that may be easily positively charged (+), and the other one thereof may include a material that may be easily negatively charged (−). Examples of the material that may be easily positively charged (+) may include polyformaldehyde, ethylcellulose, polyamide, wool, silk, Al, paper, cotton, steel, wood, Ni, Cu, Ag, and PVA. In addition, examples of the material that may be easily negatively charged (−) may include silicone rubber, Teflon, PDMS, Kapton, PP, PE, PVC, ferroelectrics, and piezoelectric materials such as electrets. Herein, the electrets may include, for example, fluoropolymers, PVF, PVDF, PCTFE, PFA polymer, FEP, ETFE, PET, and quartz. The materials described above are only illustrative and are not limited thereto.

Figure 9:
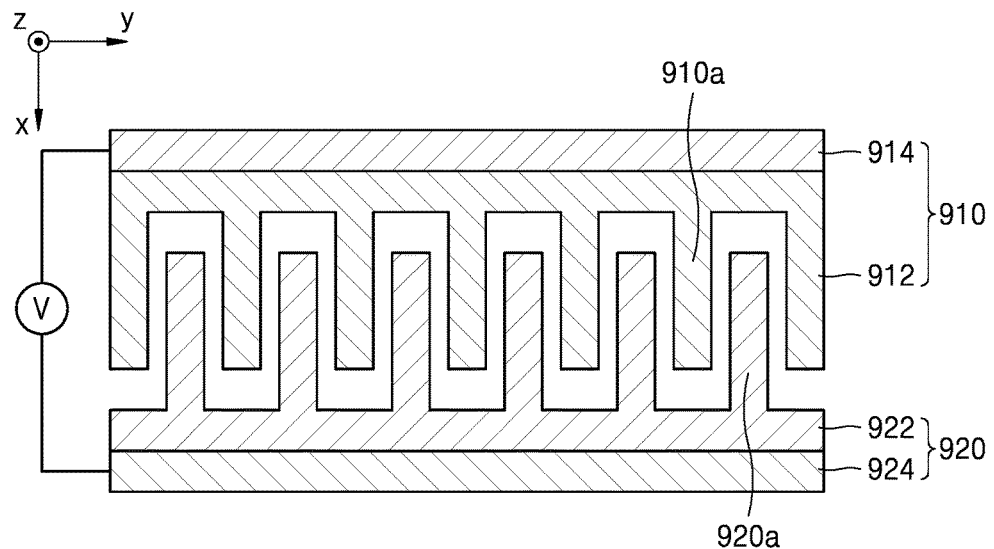

FIG. 9 is a cross-sectional view of an energy harvester according to another example embodiment.

In the description of the embodiment of FIG. 9, repeated descriptions are omitted. Referring to FIG. 9, the energy harvester may include first and second charging members 910 and 920. In addition, the first and second charging members 910 and 920 may respectively include a plurality of first and second protruding parts 910a and 920a. The first charging member 910 may include a first dielectric layer 912 and a first electrode 914. Likewise, the second charging member 920 may include a second dielectric layer 922 and a second electrode 924. The first dielectric layer 912 may include the first protruding parts 910a. In addition, the first electrode 914 may be provided below the first dielectric layer 912. The second dielectric layer 922 may include the second protruding parts 920a. In addition, the second electrode 924 may be provided below the second dielectric layer 922. When a triboelectric effect occurs between the first and second dielectric layers 912 and 922, a current may flow between the first and second electrodes 912 and 922, thereby generating electrical energy. For the occurrence of the triboelectric effect, the first and second dielectric layers 912 and 922 may include dielectric materials having different triboelectric series.

Figure 10:
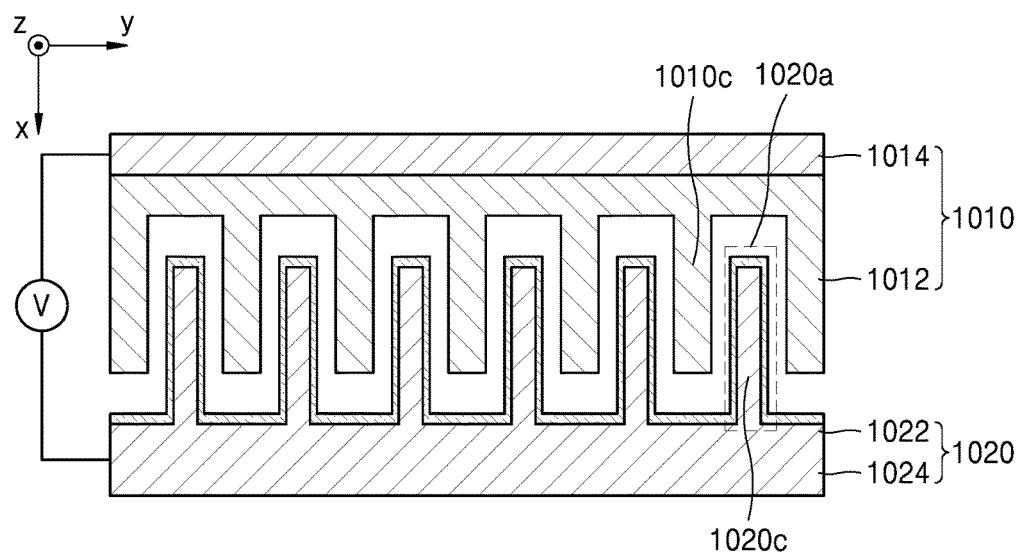
Figure 11:
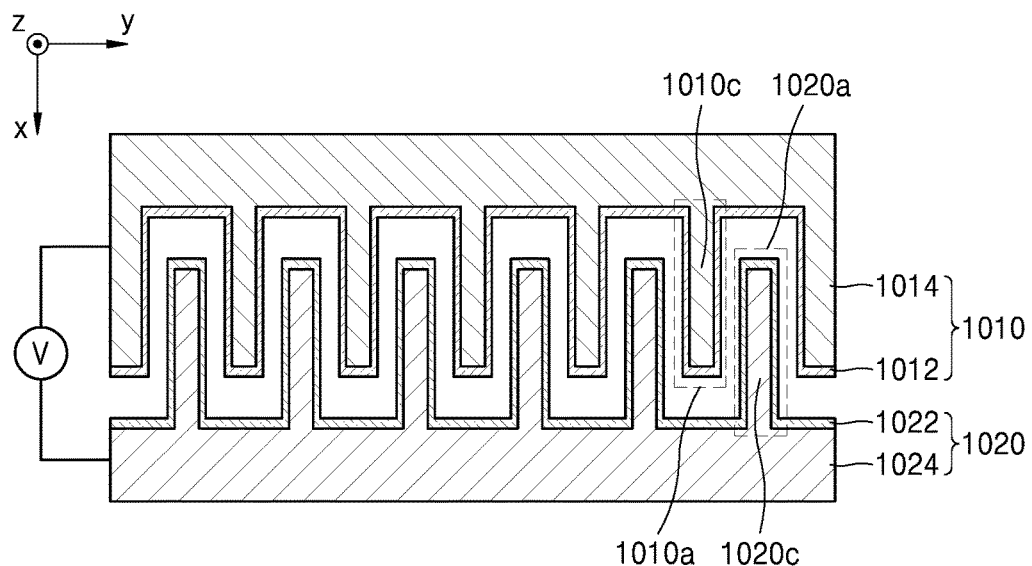

FIGS. 10 and 11 are cross-sectional views of energy harvesters according to other example embodiments.

In the description of the embodiments of FIGS. 10 and 11, repeated descriptions are omitted. Referring to FIGS. 10 and 11, the energy harvesters may include first and second charging members 1010 and 1020. In addition, the first and second charging members 1010 and 1020 may respectively include a plurality of first and second protruding parts 1010a and 1020a. Like FIG. 9, the first charging member 1010 may include a first dielectric layer 1012 and a first electrode 1014 provided below the first dielectric layer 1012. In addition, the second charging member 1020 may include a second dielectric layer 1022 and a second electrode 1024 provided below the second dielectric layer 1022. Unlike FIG. 9, the second electrode 1024 may include second posts 1020c corresponding to a shape of the second protruding parts 1020a. In addition, the second dielectric layer 1022 may be formed on a surface of the second electrode 1024. FIG. 10 shows a case where only the second dielectric layer 1022 is thinly formed. However, as shown in FIG. 11, both the first and second dielectric layers 1012 and 1022 may be thinly formed. In this case, the first electrode 1014 may also include first posts 1010c corresponding to a shape of the first protruding parts 1010a. When the first dielectric layer 1012 or the second dielectric layer 1022 is thinly formed on a surface of the first electrode 1014 or the second electrode 1024, electrified charges may move more easily.

Figure 12:
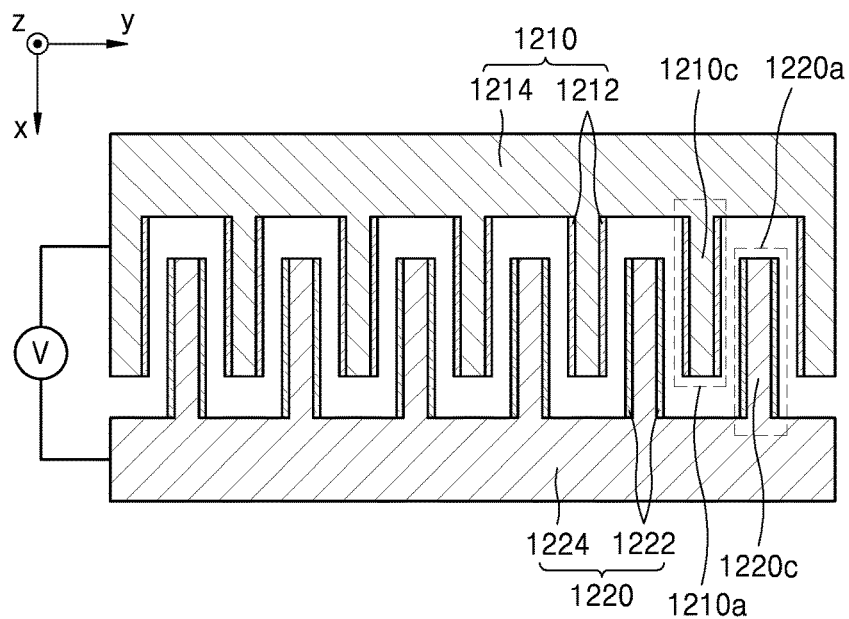

FIG. 12 is a cross-sectional view of an energy harvester according to another example embodiment.

Referring to FIG. 12, the energy harvester may include first and second charging members 1210 and 1220. In addition, the first and second charging members 1210 and 1220 may respectively include a plurality of first and second protruding parts 1210a and 1220a. Unlike FIG. 11, in the embodiment shown in FIG. 12, first and second dielectric layers 1212 and 1222 may be respectively formed only on side surfaces of first and second posts 1210c and 1220c. That is, when at least one of the first and second charging members 1210 and 1220 moves in the second direction (x-axis), the first and second dielectric layers 1212 and 1222 may be respectively formed on surfaces of the first and second protruding parts 1210a and 1220a on which triboelectrification occurs. This is only illustrative, and the first and second dielectric layers 1212 and 1222 may be respectively formed over all the surfaces of the first and second protruding parts 1210a and 1220a.

Figure 13:
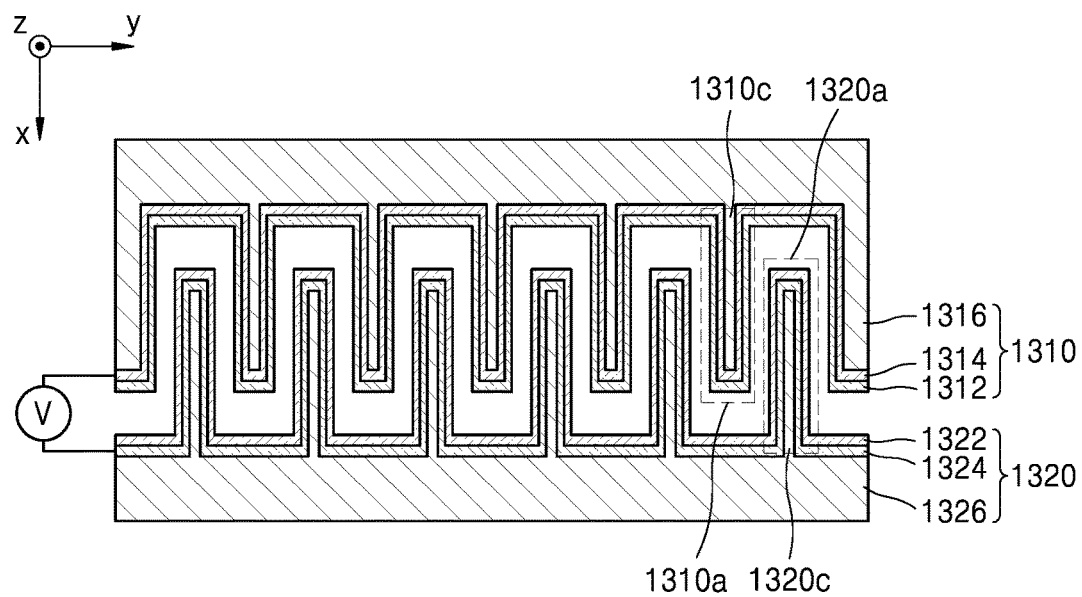

FIG. 13 is a cross-sectional view of an energy harvester according to another example embodiment.

In the description of the embodiment of FIG. 13, repeated descriptions are omitted. Referring to FIG. 13, the energy harvester may include first and second charging members 1310 and 1320. In addition, the first and second charging members 1310 and 1320 may include a plurality of first and second protruding parts 1310a and 1320a, respectively. The first charging member 1310 may include a first polymer structure 1316 having a plurality of first posts 1310c formed in a shape corresponding to the first protruding parts 1310a. In addition, a first electrode 1314 and a first dielectric layer 1312 may be provided on a surface of the first polymer structure 1316. The second charging member 1320 may also include a second polymer structure 1326 having a plurality of second posts 1320c formed in a shape corresponding to the second protruding parts 1320a. In addition, a second electrode 1324 and a second dielectric layer 1322 may be provided on a surface of the second polymer structure 1326. Although FIG. 13 shows a case where both the first and second charging members 1310 and 1320 include a polymer structure, any one of the first and second charging members may not include a polymer structure. As shown in FIG. 13, when the first and second charging members 1310 and 1320 respectively include the first and second polymer structures

1316 and 1326, a weight of the first and second charging members 1310 and 1320 may be reduced.

Various embodiments of first and second charging members which can be included in an energy harvester have been described. At least one of the first and second charging members may be configured to move in a direction orthogonal to a direction in which first and second protruding parts are formed. However, the at least one of the first and second charging members is not necessarily limited to moving only in the direction orthogonal to the direction in which the first and second protruding parts are formed. For example, at least one of the first and second charging members may also move in the same direction as the direction in which the first and second protruding parts are formed. As described above, there may be various embodiments of a method of configuring the first and second charging members.

Figure 14:
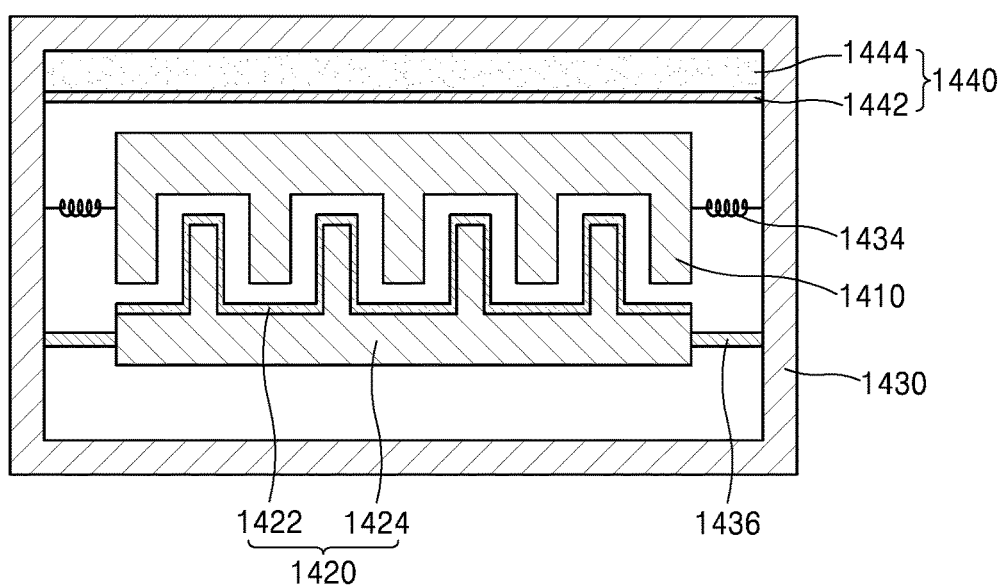

FIG. 14 is a cross-sectional view of an energy harvester according to another example embodiment.

The energy harvester shown in FIG. 14 may include first and second charging members 1410 and 1420. FIG. 14 shows that the first and second charging members 1410 and 1420 have the same structure as the first and second charging members 110 and 120 shown in FIG. 1. That is, the second charging member 1420 may include an electrode 1424 and a dielectric 1422 formed on a surface of the electrode 1424, and the first charging member 1410 may include a conductive material. This is only illustrative, and all the embodiments shown in FIGS. 1 through 13 may be applied to the first and second charging members 1410 and 1420 of FIG. 14.

Referring to FIG. 14, the energy harvester may further include a case 1430 covering the first and second charging members 1410 and 1420. The first charging member 1410 may be connected to the case 1430 by an elastic supporter 1434 inside the case 1430. The first charging member 1410 may move inside the case 1430 while being supported by the elastic supporter 1434. In this case, the first charging member 1410 may move in a direction (y-axis) orthogonal to the first direction (x-axis) in which first protruding parts of the first charging member 1410 are formed. However, the present embodiment is not limited thereto, and the first charging member 1410 may also move in the first direction (x-axis) in which the first protruding parts are formed or a direction (z-axis) orthogonal to both the first and second directions. The second charging member 1420 may be fixed by a fixing support (1436). However, this is only illustrative, and like the first charging member 1410, the second charging member 1420 may also be connected to the elastic supporter 1434 and move inside the case 1430.

When the first charging member 1410 moves inside the case 1430 by an inertial force or the like, the first charging member 1410 may receive a restoring force from the elastic supporter 1434. In this case, a number of changes in a direction of a force applied to the first charging member 1410 may increase. Then, a number of times of triboelectrification occurrence between the first and second charging members 1410 and 1420 may increase. In addition, a capacity of electrical energy generated due to the triboelectrification may also increase.

Figure 15:
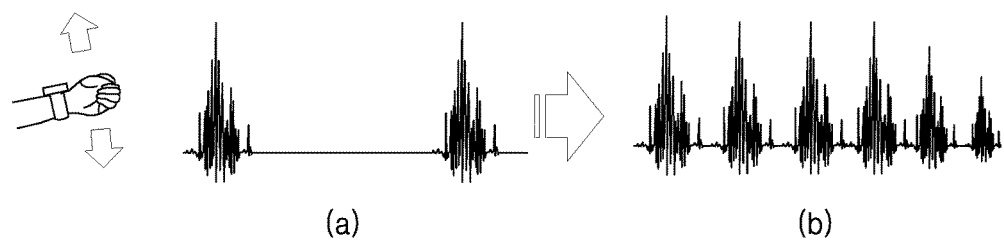
FIG. 15 illustrates a difference between electrical energy signals output from an energy harvester when an elastic supporter applies a restoring force and when the elastic supporter does not apply a restoring force.

FIG. 15 illustrates a difference between electrical energy signals output from an energy harvester when the elastic supporter 1434 applies a restoring force (a) and when the elastic supporter 1434 does not apply a restoring force (b). For example, as shown in FIG. 15, when an energy harvester according to the embodiments is equipped in a wearable device or the like, first and second charging members receive an inertial force due to a motion of a human being and the like. When at least one of the first and second charging members moves due to the inertial force, an electrical energy signal as shown in (a) of FIG. 15 may be generated by triboelectrification. However, if the elastic supporter 1434 is connected to the first charging member 1410 as shown in FIG. 14, the first charging member 1410 may receive not only an inertial force but also a restoring force. Then, the number of times of triboelectrification occurrence between the first and second charging members 1410 and 1420 may increase, and thus, a number of times an electrical energy signal is generated may increase as shown in (b) of FIG. 15.

In FIG. 14, the first charging member 1410 may move not only in the second direction (y-axis) but also in the first direction (x-axis). In this case, electrical energy generated by triboelectrification between the first and second charging members 1410 and 1420 may also be generated by a motion along the first direction (x-axis). In addition, to increase a generation capacity of electrical energy by triboelectrification, a third charging member 1430 may be formed on an inner wall of the case 1430. The third charging member 1430 may include a dielectric layer 1442 and an electrode 1444, but is not limited thereto. The third charging member 1440 may be provided on an inner wall of the case 1430. In FIG. 14, the third charging member 1440 is provided on a surface parallel to the second direction (y-axis), but is not limited thereto, and the third charging member 1440 may be provided on a surface parallel to the first direction (x-axis) or a surface orthogonal to both the first and second directions (x- and y-axes). As shown in FIG. 14, if the third charging member 1440 is provided on the inner wall of the case 1430, when the first charging member 1410 moves in the first direction (x-axis), the first charging member 1410 may contact the third charging member 1430, or a gap between the first charging member 1410 and the third charging member 1430 may be changed. Accordingly, electrical energy may be generated by triboelectrification.

Figure 16:
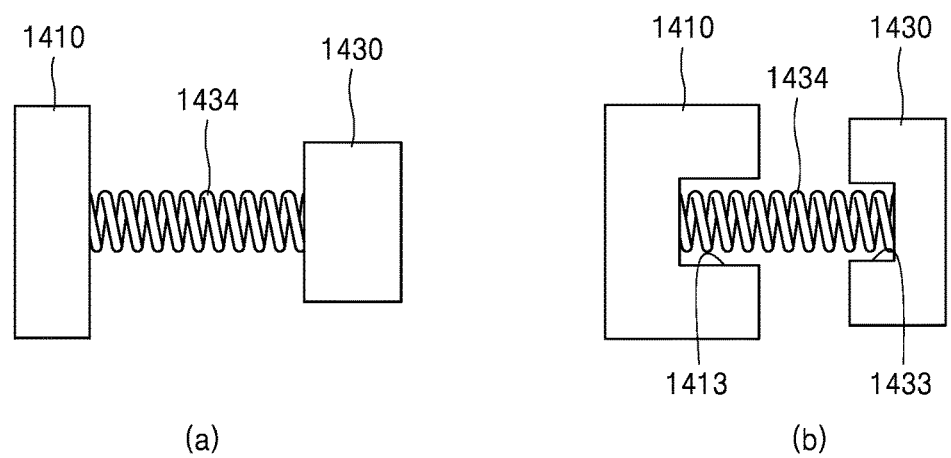
FIG. 16 shows examples in which an elastic supporter shown in FIG. 14 is installed.

FIG. 16 shows examples in which the elastic supporter 1434 shown in FIG. 14 is installed. Referring to FIG. 16, the elastic supporter 1434 may be provided between the first charging member 1410 and the case 1430. As shown in (a) of FIG. 16, the elastic supporter 1434 may be simply installed between an outer wall of the first charging member 1410 and an inner wall of the case 1430. Alternatively, as shown in (b) of FIG. 16, to reduce an installation space, a groove 1413 may be prepared on an outer wall of the first charging member 1410, and a groove 1433 may be prepared on an inner wall of the case 1430. In addition, the elastic supporter 1434 may be disposed between the groove 1413 of the first charging member 1410 and the groove 1433 of the case 1430. Although (b) of FIG. 16 shows a case where the grooves 1413 and 1433 are provided respectively in the first charging member 1410 and the case 1430, a groove may be provided in only one of the first charging member 1410 and the case 1430.

Figure 17:
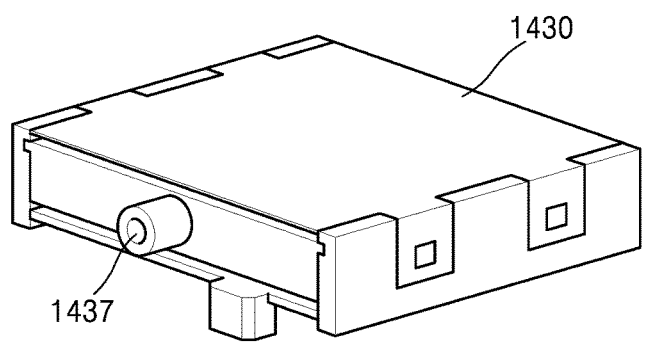
FIG. 17 is a perspective view of a case of the energy harvester shown in FIG. 14.

FIG. 17 is a perspective view of the case 1430 of the energy harvester shown in FIG. 14.

Referring to FIG. 17, a cable hole 1437 for delivering electrical energy generated by the energy harvester to the outside may be provided outside of the case 1430. The energy harvester shown in FIG. 17 may be used to convert kinetic energy into electrical energy by being embedded in a mobile device, a wearable device, a device for hydroelectric power generation, wind power generation, or the like.

Figure 18:
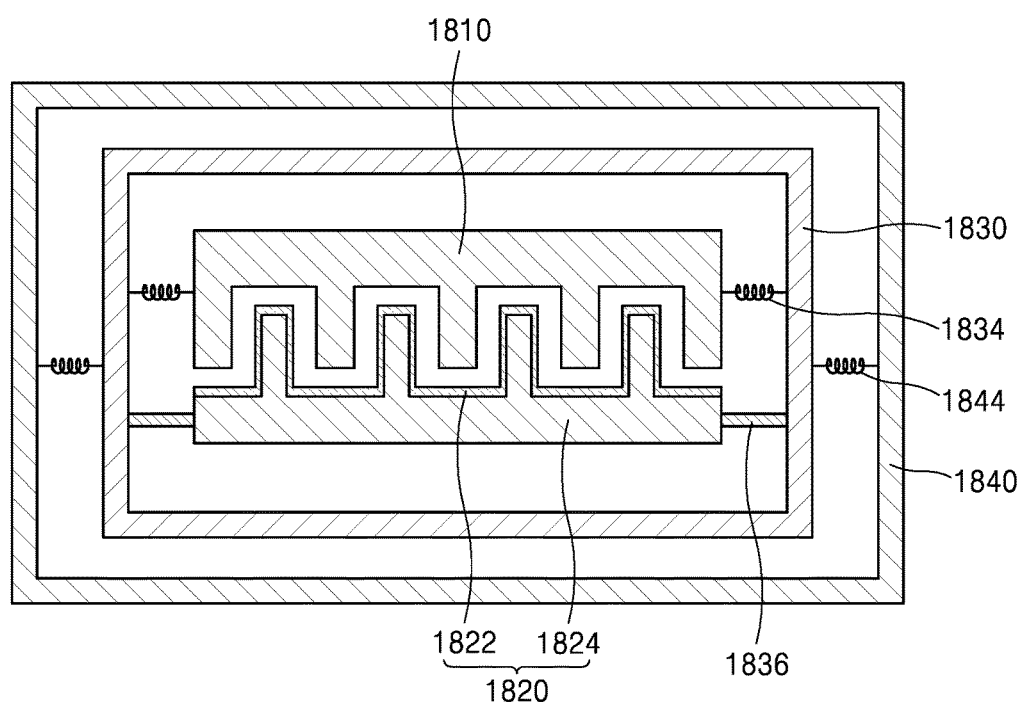
FIG. 18 is a cross-sectional view of an energy harvester according to another example embodiment.

Although FIG. 14 shows a case in which one case 1430 is used for the energy harvester, the energy harvester may include a plurality of cases. FIG. 18 is a cross-sectional view of an energy harvester according to another example embodiment.

Referring to FIG. 18, the energy harvester may include first and second charging members 1810 and 1820 and first and second cases 1830 and 1840. The second charging member 1820 may include a dielectric layer 1822 and an electrode 1824. The first and second charging members 1810 and 1820 shown in FIG. 18 are only illustrative and may be replaced with any of the embodiments of FIGS. 1 through 13. Similarly to the description provided with reference to FIG. 14, the first charging member 1810 may be connected to the first case 1830 by a first elastic supporter 1834 provided inside the first case 1830. In addition, the first case 1830 may be connected to the second case 1840 by a second elastic supporter 1844 provided inside the second case 1840. When the first case 1830 moves inside the second case 1840, the first case 1830 may receive a restoring force from the second elastic supporter 1844. In addition, the restoring force received by the first case 1830 may be delivered to the first charging member 1810 through the first elastic supporter 1834. As shown in FIG. 18, by installing the second elastic supporter 1844 between the first case 1830 and the second case 1840, a number of vibratory motions between the first and second charging members 1810 and 1820 may increase. Alternatively, the first elastic supporter 1834 may be installed between the first charging member 1810 and the second charging member 1820 to increase the number of vibrations.

Figure 19:
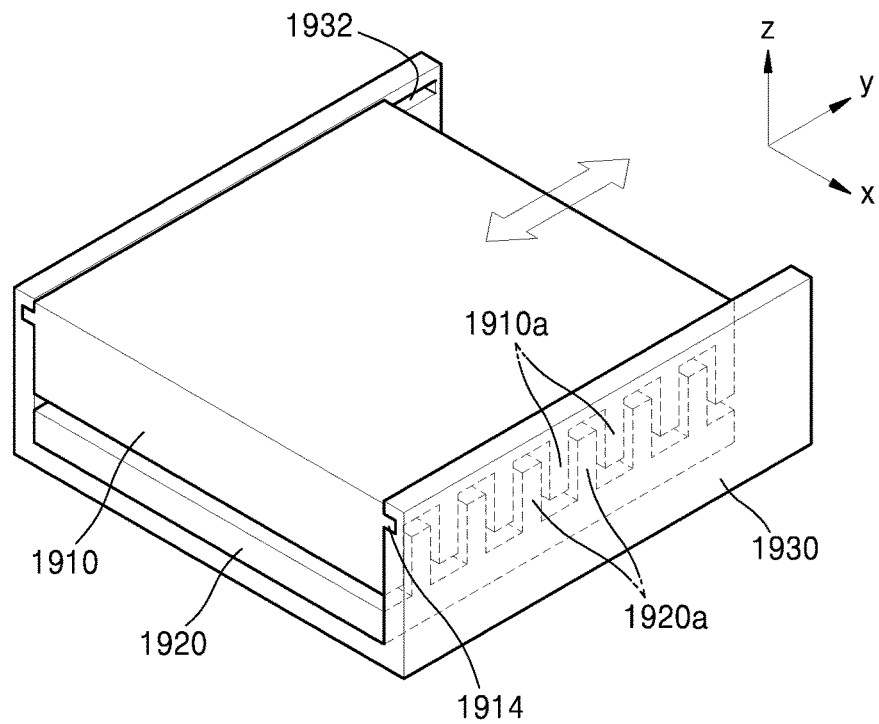
FIGS. 19 and 20 are perspective views of energy harvesters according to other example embodiments.

FIG. 19 is a perspective view of an energy harvester according to another example embodiment.

Referring to FIG. 19, the energy harvester may include first and second charging members 1910 and 1920. All the embodiments described with reference to FIGS. 1 through 13 may be applied to the first and second charging members 1910 and 1920. The energy harvester may include a guide member 1930 configured to guide at least one of the first and second charging members 1910 and 1920 to move in the second direction (y-axis) orthogonal to the first direction (x-axis) in which first and second protruding parts are formed.

The guide member 1930 may function to guide at least one of the first and second charging members 1910 and 1920 to move in the second direction (y-axis direction). To this end, as shown in FIG. 19, the guide member 1930 may include a guide groove 1932 formed in the second direction (y-axis direction). In addition, at least one of the first and second charging members 1910 and 1920 may include a protruding part 1914 fitted into the guide groove 1932. FIG. 1 illustrates a case where the second charging member 1920 is fixed and the first charging member 1910 is movable along the guide groove 1932 of the guide member 1930. However, the present embodiment is not limited thereto. For example, the first charging member 1910 may be fixed to the guide member 1930, and the second charging member 1920 may move in the second direction (y-axis direction). As another example, both the first and second charging members 1910 and 1920 may move in the second direction (y-axis direction). In this case, the guide member 1930 may include an additional guide groove such that both the first and second charging members 1910 and 1920 are movable.

In addition, although not shown, the guide member 1930 may include a restoring force member configured to restore a position of at least one of the first and second charging members 1910 and 1920 when the at least one of the first and second charging members 1910 and 1920 moves. Examples of the restoring force member may include elastic materials such as a spring and rubber, and a magnetic material such as a magnet. A number of motions of the first charging member 1910 or the second charging member 1920 may be increased by the restoring force member. That is, when the guide member 1930 includes the restoring force member, the first charging member 1910 or the second charging member 1920 may be moved and then moved back by the restoring force member. Accordingly, the number of motions of the first charging member 1910 or the second charging member 1920 may be increased by an elastic member. In addition, along with the increase in the number of motions, a generation capacity of electrical energy of the energy harvester may also increase.

Figure 20:
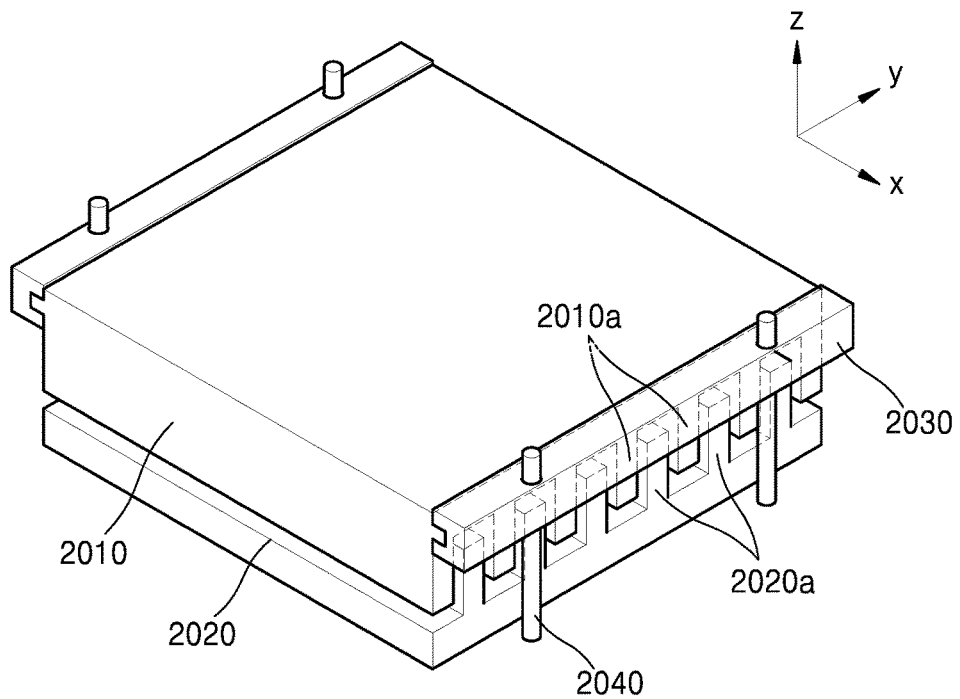

FIG. 20 is a perspective view of an energy harvester according to another example embodiment.

Referring to FIG. 20, the energy harvester may include a first charging member 2010 including a plurality of first protruding parts 2010a formed in the first direction (x-axis) and a second charging member 2020 including a plurality of second protruding parts 2020a arranged between the first protruding parts 2010a. In addition, the energy harvester may include a first guide member 2030 configured to guide at least one of the first and second charging members 2010 and 2020 to move in a direction (y-axis) orthogonal to a direction (x-axis) in which the first and second protruding parts 2010a and 2020a are formed. In addition, the energy harvester may further include a second guide member 2040 configured to guide at least one of the first and second charging members 2010 and 2020 to move in the first direction (x-axis). In this case, all the embodiments described with reference to FIGS. 1 through 13 may be applied to the first and second charging members 2010 and 2020.

The second guide member 2040 may include at least one guide shaft penetrating through the first guide member 130. Therefore, when the first guide member 2030 moves along the guide shaft, at least one of the first and second charging members 2010 and 2020 may move in the first direction (x-axis). In FIG. 20, the first guide member 2030 is connected to the first charging member 2010. Therefore, the first charging member 2010 may move in a direction in which a shaft is formed along the second guide member 2040. However, the present embodiment is not limited thereto. For example, when the first guide member 2030 is also connected to the second charging member 2020, the second charging member 2020 may also move in the direction in which a shaft is formed along the second guide member 2040. Although not shown, the second guide member 1200 may include a restoring force member configured to apply a restoring force for restoring a position of at least one of the first and second charging members 2010 and 2020 when the at least one of the first and second charging members 2010 and 2020 moves. Examples of the restoring force member may include elastic materials such as a spring and rubber, and a magnetic material such as a magnet. In addition, the restoring force member may be inserted into a shaft included in the second guide member 2040. The first and second charging members 2010 and 2020 and the first and second guide members 2030 and 2040 described above may also be embedded in a case as described with reference to FIGS. 14 and 18.

The energy harvesters including first and second charging members have been described according to example embodiments. In the above descriptions, first and second charging members respectively include a plurality of first and second protruding parts, but the embodiments are not limited thereto.

Figure 21:
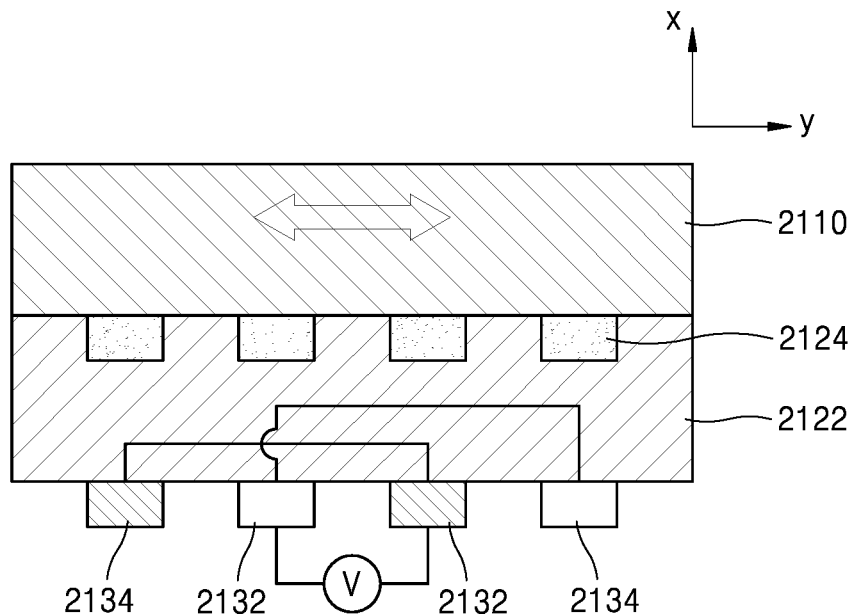
FIGS. 21 through 27 are cross-sectional views of energy harvesters according to other example embodiments.

FIG. 21 is a cross-sectional view of an energy harvester according to another example embodiment.

Referring to FIG. 21, the energy harvester may include a first charging member 2110 and a second charging member 2120. The second charging member 2120 includes a first charging material layer 2122 having a plurality of protruding parts 2120a formed on a surface thereof and including a material different from that of the first charging member 2110, and a second charging material layer 2124 disposed between the protruding parts and including a material different from materials of the first charging member 2110 and the first charging material layer 2122.

The first charging member 2110, the first charging material layer 2122, and the second charging material layer 2124 may respectively include materials having different triboelectric series. For example, when the first charging member 2110 includes a conductive material, the first and second charging material layers 2122 and 2124 may include different dielectrics. In addition, when the first charging member 2110 includes a dielectric, the first and second charging material layers 2122 and 2124 may each include a dielectric different from that of the first charging member 2110. When the first charging member 2110 includes a dielectric, the second charging material layer 2124 may include a conductive material instead of a dielectric. When the first and second charging members 2110 and 2120 are in contact with each other, or a gap between the first and second charging members 2110 and 2120 is changed, electrical energy may be generated by triboelectrification between the first charging member 2110 and the first and second charging material layers 2122 and 2124. A potential change may occur due to contact or a distance change between the first charging member 2110 and the first charging material layer 2122 and between the first charging member 2110 and the second charging material layer 2124. Accordingly, electrical energy may be generated. Herein, the triboelectrification includes not only a case where contact occurs between the first and second charging members 2110 and 2120 but also a case where only a gap, i.e., a distance, between the first and second charging members 2110 and 2120 is simply changed. For example, when at least one of the first and second charging material layers 2122 and 2124 includes a normally charged material such as a ferroelectric material or an EAP, electrical energy may be generated even when a gap between the first and second charging members 2110 and 2120 is changed without contact of the first and second charging members 2110 and 2120.

Examples of the dielectrics which may be included in the first charging member 2110 and the first and second charging material layers 2122 and 2124 may include at least one of piezoelectric materials, ferroelectric materials, an EAP, and pyroelectric materials. In detail, first and second dielectrics may include polyformaldehyde, ethylcellulose, polyamide, wool, silk, paper, cotton, steel, wood, PVA, silicone rubber, Teflon, PDMS, Kapton, polypropylene, polyethylene, PVC, fluorine polymer (e.g., PVF), PVDF, PTFE, PCTFE, PFA polymer, FEP, ETFE, PP, PET, quartz, PZT, ZnO, BTO, and the like, but are not limited thereto.

In addition, examples of the conductive material which may be included in any one of the first charging member 2110 and the second charging material layer 2124 may include a metal, graphene, CNTs, ITO, and a conductive polymer. However, this is only illustrative, and the present embodiment is not limited thereto. Examples of the metal may include Al, Mg, Cu, Pb, Fe, Ni, Ag, Pt, and Au. In addition, the conductive polymer may include, for example, PCBM. However, the present embodiment is not limited thereto.

The first and second charging material layers 2122 and 2124 may be charged differently when triboelectrification with the first charging member 2110 occurs. For example, when the first and second charging members 2110 and 2120 are in contact with each other, or when a gap between the first and second charging members 2110 and 2120 is changed, the first charging material layer 2122 of the second charging member 2120 may be positively charged (+), and the second charging material layer 2124 may be negatively charged (−). Of course, an opposite case is possible. To this end, any one of the first charging material layer 2122 and the second charging material layer 2124 may include a material that may be relatively easily positively charged (+), and the other one thereof may include a material that may be relatively easily negatively charged (−).

In this case, examples of the material that may be easily positively charged (+) may include polyformaldehyde, ethylcellulose, polyamide, wool, silk, Al, paper, cotton, steel, wood, Ni, Cu, Ag, and PVA. In addition, examples of the material that may be easily negatively charged (−) may include silicone rubber, Teflon, PDMS, Kapton, PP, PE, PVC, ferroelectrics, and piezoelectric materials such as electrets. Herein, the electrets may include, for example, fluoropolymers, PVF, PVDF, PCTFE, PFA polymer, FEP, ETFE, PET, and quartz. The materials described above are only illustrative and are not limited thereto.

A first electrode 2132 and a second electrode 2134 may be provided below the first charging material layer 2122 of the second charging member 2120. The first electrode 2132 and the second electrode 2134 may be electrically isolated from each other. In addition, as shown in FIG. 21, the first electrode 2132 may include a plurality of first sub-electrodes 2132 arranged in an arrangement direction of the protruding parts 2120a and electrically connected to each other. In addition, the second electrode 2134 may include a plurality of second sub-electrodes 2134 arranged in the arrangement direction of the protruding parts 2120a and electrically connected to each other. This is only illustrative, and the first electrode 2132 and the second electrode 2134 may be configured as single electrodes, respectively. When the first charging member 2110 moves to the left and right on the second charging member 2120, a triboelectric effect may occur at the first charging material layer 2122 and the second charging material layer 2124 of the second charging member 2120. In this case, since a distance from the surface of the first charging member 2110 varies with respect to each surface of the second charging member 2120, different potentials may be induced in the first electrode 2132 and the second electrode 2134. The energy harvester may generate electrical energy by using a potential difference between the first and second electrodes 2132 and 2134.

Figure 22:
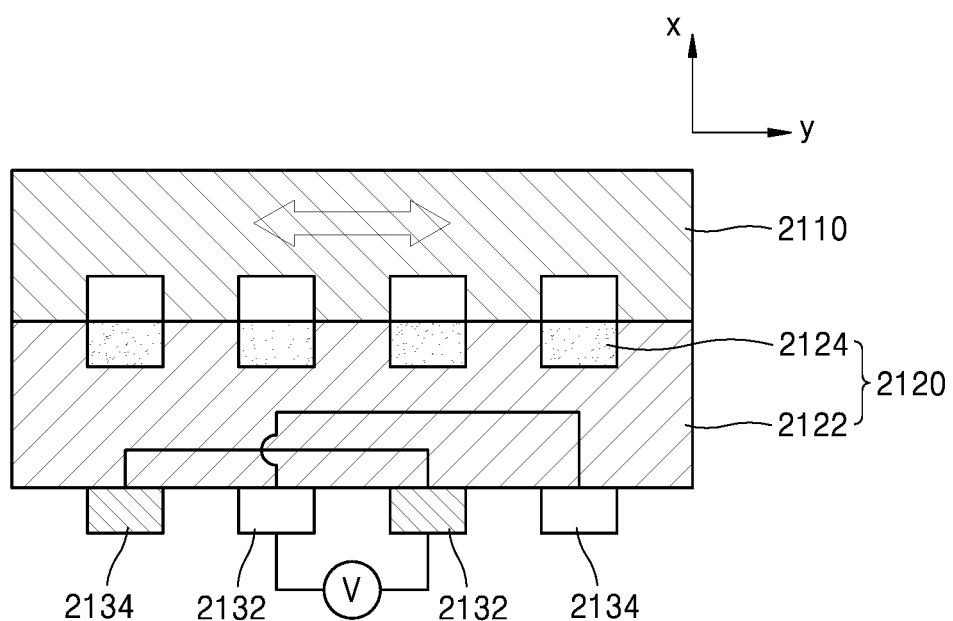

FIG. 22 is a cross-sectional view of an energy harvester according to another example embodiment.

In the description of the embodiment of FIG. 22, repeated descriptions of FIG. 21 are omitted. Referring to FIG. 22, the first charging member 2110 of FIG. 21 may include a plurality of protruding parts 2110a. As such, with a level difference on a surface of the first charging member 2110, a triboelectric effect may be better than without the level difference. However, since the second charging material layer 2124 is inserted between the protruding parts 2120a of the first charging material layer 2122, a surface level difference of the second charging member 2120 may be reduced. In this case, the first charging member 2110 may move relatively freely on the second charging member 2120.

Figure 23:
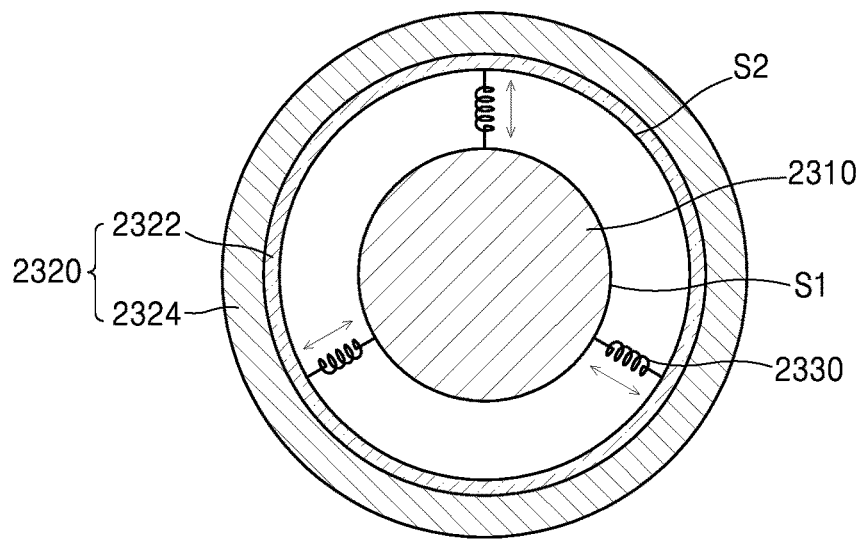

FIG. 23 is a cross-sectional view of an energy harvester according to another example embodiment.

Referring to FIG. 23, the energy harvester may include a first charging member 2310 and a second charging member 2320 spaced apart from and surrounding the first charging member 2310 and including a material different from that of the first charging member. In this case, when at least one of the first and second charging members 2310 and 2320 moves, an outer surface S1 of the first charging member 2310 and an inner surface S2 of the second charging member 2320 may be in contact with each other, or a gap between the outer surface S1 of the first charging member 2310 and the inner surface S2 of the second charging member 2320 may be changed. Accordingly, electrical energy may be generated by triboelectrification. As described above, the triboelectrification includes not only a case where the outer surface S1 of the first charging member 2310 and the inner surface S2 of the second charging member 2320 are in contact with each other, but also a case where electrical energy is generated by a potential difference due to a simple change in the gap between the outer surface S1 of the first charging member 2310 and the inner surface S2 of the second charging member 2320.

In FIG. 23, the first charging member 2310 may have a disc shape or a spherical shape. However, the first charging member 2310 is not limited thereto. In addition, the first charging member 2310 may include a first electrode including a conductive material. Therefore, the first electrode may act as an electrode and simultaneously cause triboelectrification to occur. The second charging member 2320 may have a ring shape or a spherical shape surrounding the first charging member 2310. The second charging member 2320 may include a dielectric layer 2322 on the inner surface S2. In addition, the second charging member 2320 may include a second electrode 2324 provided outside the dielectric layer 2322.

Examples of a material which may be included in the dielectric layer 2322 may include at least one of piezoelectric materials, ferroelectric materials, an EAP, and pyroelectric materials. In detail, first and second dielectrics may include polyformaldehyde, ethylcellulose, polyamide, wool, silk, paper, cotton, steel, wood, PVA, silicone rubber, Teflon, PDMS, Kapton, polypropylene, polyethylene, PVC, fluorine polymer (e.g., PVF), PVDF, PTFE, PCTFE, PFA polymer, FEP, ETFE, PP, PET, quartz, PZT, ZnO, BTO, and the like. The dielectric layer 2322 may be prepared by at least one of a surface treatment method, a ferroelectric nanoparticle insertion method, and a method of controlling a property of matter by heterogeneous polymer stacking. In addition, the conductive material which may be included in the first electrode of the first charging member 2310 may include at least one of a metal, graphene, CNTs, ITO, and a conductive polymer. The metal may include at least one of Al, Mg, Cu, Pb, Fe, Ni, Ag, Pt, Au, and an alloy thereof. In addition, the conductive polymer may include, for example, PCBM. The conductive material may also be included in the electrode 2324 of the second charging member 2320.

The energy harvester shown in FIG. 23 may further include an elastic supporter 2330 provided between the outer surface S1 of the first charging member 2310 and the inner surface S2 of the second charging member 2320 and applying a restoring force to at least one of the first charging member 2310 and the second charging member 2320. The first and second charging members 2310 and 2320 may be connected to each other by the elastic supporter 2330. To reduce an installation space, as shown in (b) of FIG. 16, the groove 1413 may be prepared on an outer wall of the first charging member 1410, and the groove 1433 may be prepared on an inner wall of the case 1430. The first charging member 2310 may move in a vacant space provided in the second charging member 2320 while being supported by the elastic supporter 2330. When the first charging member 2310 moves in the vacant space of the second charging member 2320, the elastic supporter 2330 may apply a restoring force to at least one of the first and second charging members 2310 and 2320. A number of vibrations of the first and second charging members 2310 and 2320 may increase due to this restoring force. In addition, a generation capacity of electrical energy may be increased by the increase in the number of vibrations.

Figure 24:
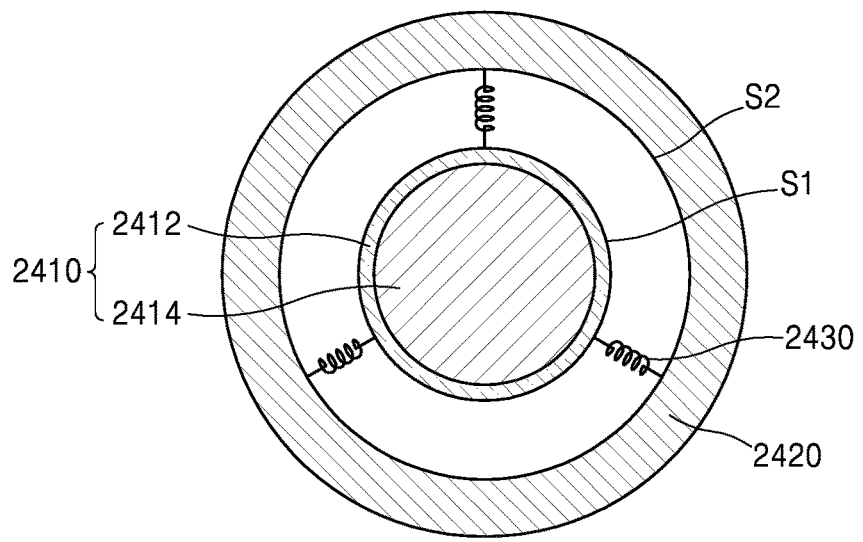

FIG. 24 is a cross-sectional view of an energy harvester according to another example embodiment.

In the description of the embodiment of FIG. 24, repeated descriptions of FIG. 23 are omitted. Referring to FIG. 24, a first charging member 2410 may include a dielectric layer 2412 on an outer surface S1 thereof and a first electrode 2414 inside the outer surface S1 and in contact with the dielectric layer 2412. In addition, a second charging member 2420 may include a second electrode including a conductive material. Herein, the conductive material of the second electrode may cause triboelectrification to occur and simultaneously act as an electrode. The first charging member 2410 of FIG. 24 may have a disc or spherical shape. In addition, the second charging member 2420 may have a ring or spherical shape and surround the first charging member 2410. This is only illustrative and is not limited thereto. In addition, the energy harvester of FIG. 24 may further include an elastic supporter 2430 provided between the outer surface S1 of the first charging member 2410 and an inner surface S2 of the second charging member 2420 and applying a restoring force to at least one of the first charging member 2410 and the second charging member 2420.

Figure 25:
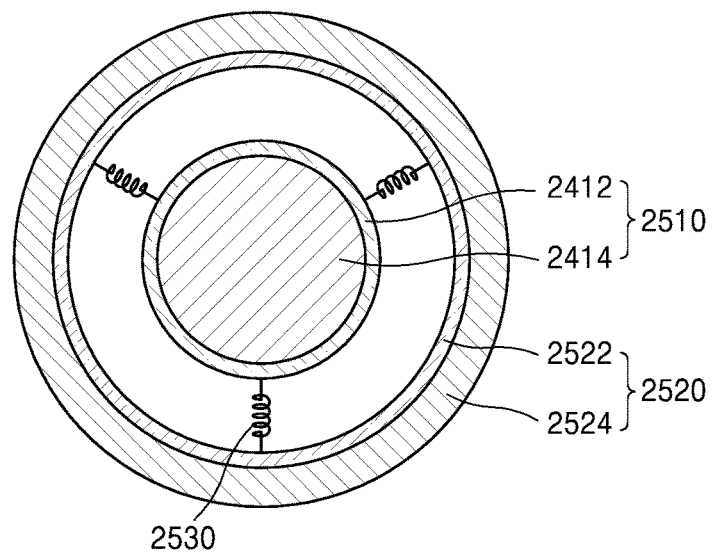

FIG. 25 is a cross-sectional view of an energy harvester according to another example embodiment.

In the description of the embodiment of FIG. 25, repeated descriptions of FIGS. 23 and 24 are omitted. Referring to FIG. 25, a first charging member 2510 may include a first dielectric layer 2512 on an outer surface S1 thereof and a first electrode 2514 inside the outer surface S1. In addition, a second charging member 2520 may include a second dielectric layer 2522 on an inner surface S2 thereof and a second electrode 2524 outside the inner surface S2. The first and second dielectric layers 2512 and 2522 may include materials having different triboelectric series. In addition, the energy harvester of FIG. 25 may further include an elastic supporter 2530 provided between the outer surface S1 of the first charging member 2510 and the inner surface S2 of the second charging member 2520 and applying a restoring force to at least one of the first charging member 2510 and the second charging member 2520.

Figure 26:
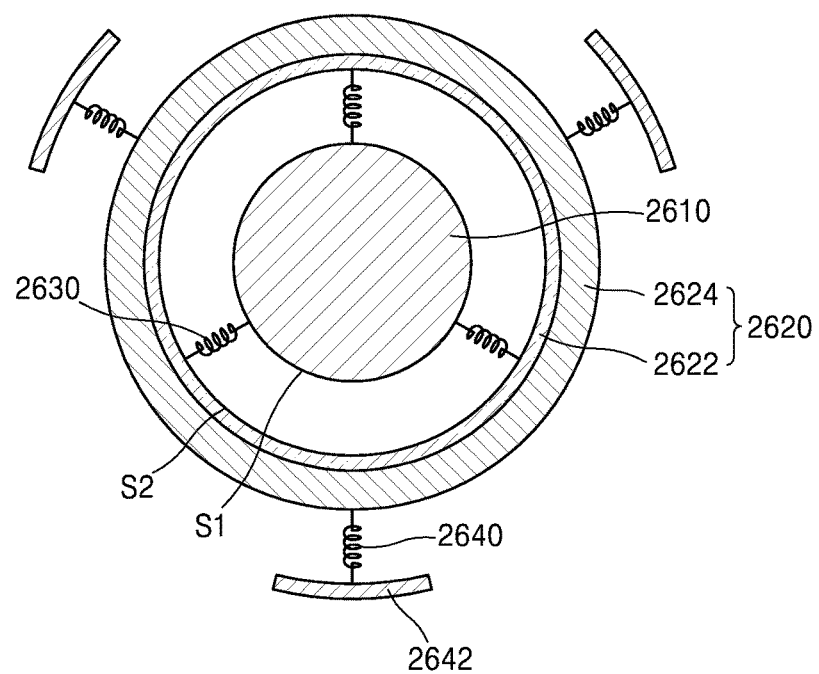

FIG. 26 is a cross-sectional view of an energy harvester according to another example embodiment.

Referring to FIG. 26, like FIG. 23, the energy harvester may include a first charging member 2610, a second charging member 2620, and a first elastic supporter 2630 provided between an outer surface S1 of the first charging member 2610 and an inner surface S2 of the second charging member 2620. FIG. 26 shows a case in which the first charging member 2610 includes a first electrode including a conductive material and the second charging member 2620 includes a dielectric layer 2622 on an inner surface S2 thereof and a second electrode 2644 outside the inner surface S2. However, the embodiments of FIGS. 24 and 25 may be applied to the first and second charging members 2610 and 2620 of FIG. 26. A second elastic supporter 2640 configured to apply a restoring force may be provided on an outer surface S3 of the second charging member 2620. The second elastic supporter 2640 may be provided between the second charging member 2620 and another support 2642. Herein, the support 2642 may be included in a case configured to accommodate the second charging member 2620. The second elastic supporter 2640 may increase a number of vibratory motions between the first and second charging members 2610 and 2620 by applying a restoring force to the second charging member 2620 when the second charging member 2620 moves.

Figure 27:
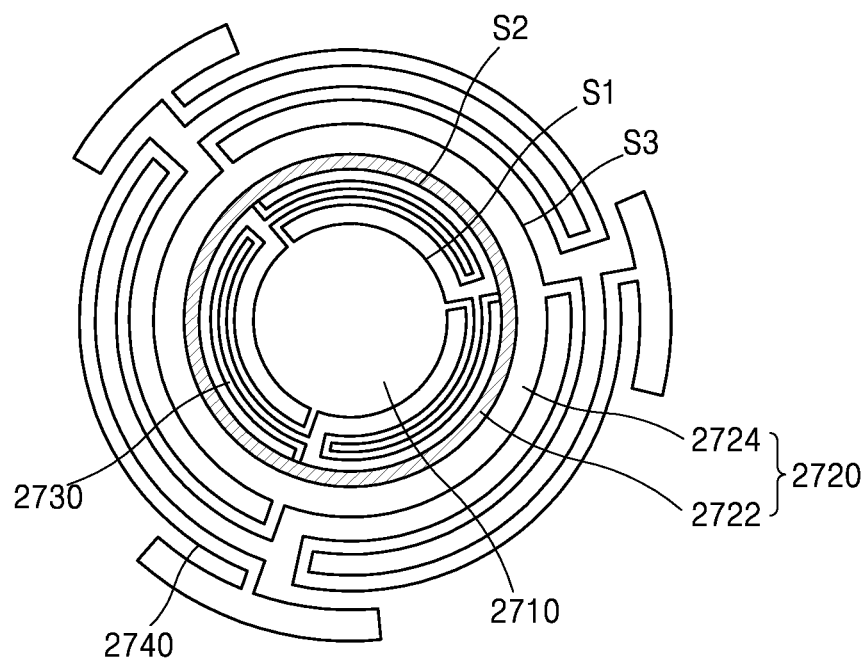

FIG. 27 is a cross-sectional view of an energy harvester according to another example embodiment.

Referring to FIG. 27, like FIG. 26, the energy harvester may include a first charging member 2710, a second charging member 2720, a first elastic supporter 2730 provided between an outer surface S1 of the first charging member 2710 and an inner surface S2 of the second charging member 2710, and a second elastic supporter 2740 provided on an outer surface S3 of the second charging member 2720. Unlike FIG. 26, the first and second elastic supporters 2730 and 2740 may have a curved shape. In this case, the curved shape of the first and second elastic supporters 2730 and 2740 may correspond to a curved surface of the outer surface S1 of the first charging member 2710 or the inner surface S2 of the second charging member 2720.

Figure 28:
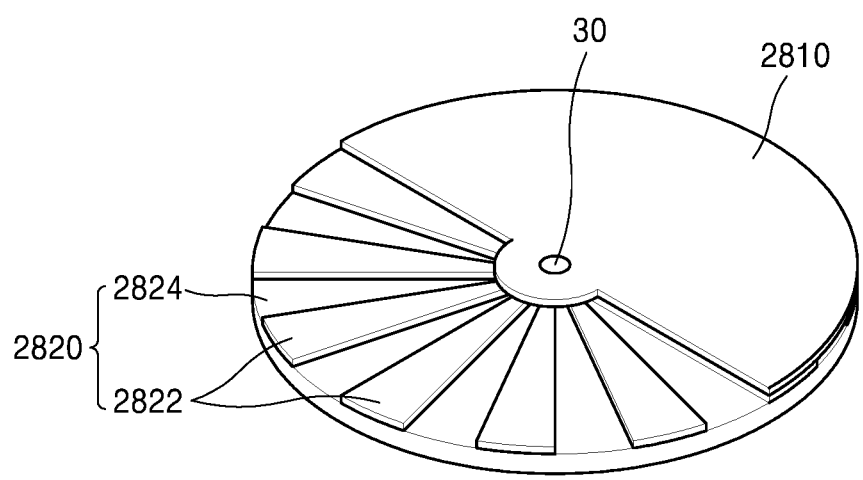
FIG. 28 is a perspective view of an energy harvester according to another example embodiment.

FIG. 28 is a perspective view of an energy harvester according to another example embodiment. Referring to FIG. 28, the energy harvester may include a first charging member 2810 including a first electrode and a second charging member 2820 provided facing the first charging member 2810 and including a plurality of dielectric layers 2822 arranged in a radial shape. The energy harvester may generate electrical energy by a relative rotary motion between the first charging member 2810 and the second charging member 2820. By the relative rotary motion between the first charging member 2810 and the second charging member 2820, a distance between the first charging member 2810 and each of the plurality of dielectric layers 2822 of the second charging member 2820 may vary. Accordingly, a potential difference may occur between each of the plurality of dielectric layers 2822 and the first charging member 2810, thereby generating electrical energy.

As shown in FIG. 28, the first charging member 2810 including the first electrode may have a smaller area than the second charging member 2820 in order to be spaced apart from some of the plurality of dielectric layers 2822. In addition, the first charging member 2810 may have a disc shape, and the second charging member 2820 may have a semi-disc shape. The semi-disc shape does not mean that a shape of a plate is necessarily a semicircle in a strict sense. For example, the second charging member 2820 may have a shape of a plate having an arc shape of a circle and a random central angle. The first and second charging members 2810 and 2820 may be connected to each other so as to mutually enable a relative rotary motion. For example, although not shown, the first charging member 2810 and the second charging member 2820 may be connected through a hinge formed at a point 30 through which a rotary shaft passes. This is only illustrative and is not limited thereto.

The first charging member 2810 may include a conductive material. Therefore, the first charging member 2810 may simultaneously act as an electrode. The conductive material may include at least one of a metal, graphene, CNTs, ITO, and a conductive polymer. In addition, the metal may include at least one of Al, Mg, Cu, Pb, Fe, Ni, Ag, Pt, Au, and an alloy thereof. In addition, the plurality of dielectric layers 2722 described above may include at least one of piezoelectric materials, ferroelectric materials, an EAP, and pyroelectric materials. The materials described above are only illustrative and are not limited thereto.

Figure 29:
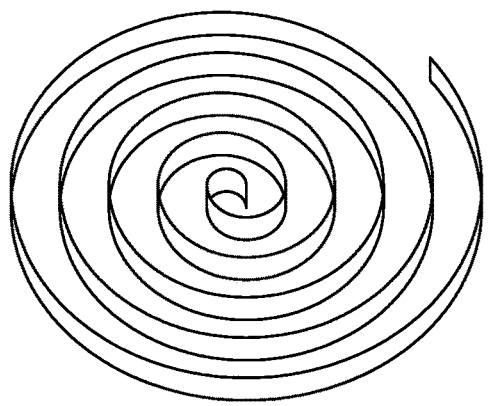
FIG. 29 is a perspective view of an elastic body according to an example embodiment.

The energy harvester may further include an elastic body provided on the rotary shaft of the first and second charging members 2810 and 2820. FIG. 29 is a perspective view of the elastic body according to an example embodiment. The elastic body of FIG. 29 may be provided on the rotary shaft of the first and second charging members 2810 and 2820, and a shape of the elastic body may be changed when the first charging member 2810 or the second charging member 2820 rotates. For example, the elastic body may apply a restoring force to at least one of the first and second charging members 2810 and 2820 by being wound or unwound. By doing this, the number of rotary motions between the first and second charging members 2810 and 2820 may increase.

The energy harvesters according to example embodiments have been described with reference to FIGS. 1 through 29. In the above description, examples in which an energy harvest includes two or three charging members have been described, but the embodiments are not limited thereto. For example, according to circumstances, fourth and fifth charging members may be additionally stacked, and electrical energy may also be generated by motions therebetween. In addition, a plurality of polymer material layers may be added to or surface treatment may be performed on first and second charging members to change a work function of an interface. The plurality of polymer material layers may include fluorocarbon-group materials including CF, $C_2F_2$, $C_2F_4$, and the like. In addition, specific examples of the surface treatment may include plasma surface treatment, self-assembly monolayer surface treatment, coating, implant, composite, and stacking. The energy harvest according to the embodiments described above may be additionally coupled to a piezoelectric, thermoelectric, or electromagnetic vibration power generation element or a solar cell to form a hybrid power generation element.

Figure 30:
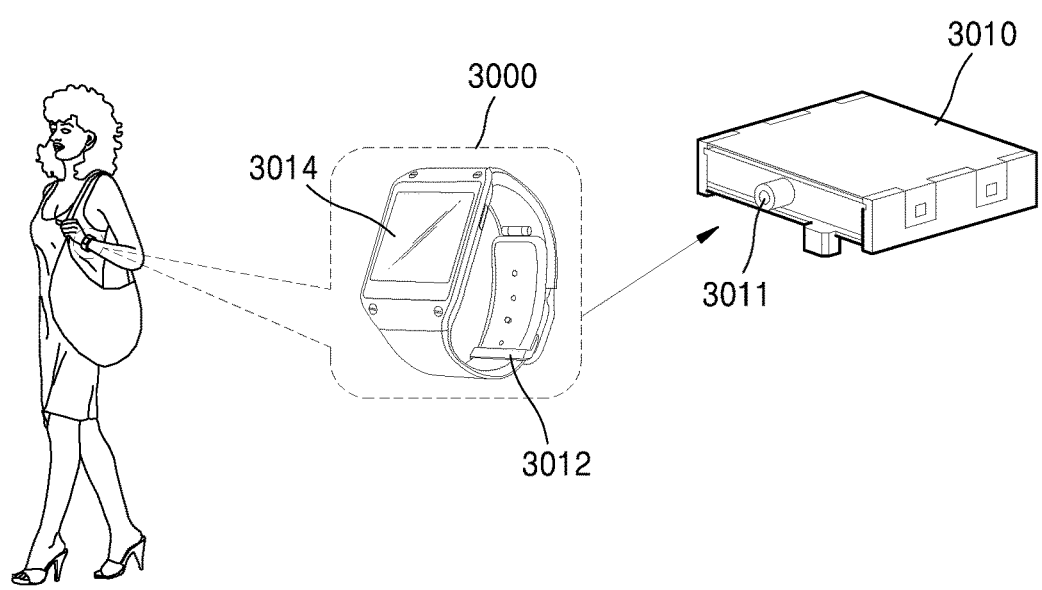
FIG. 30 is a perspective view of a smart watch including the energy harvester according to example embodiments.

The energy harvest shown in FIGS. 1 through 29 may be embedded in a mobile device or a wearable device and used as a power supply source. FIG. 30 is a perspective view of a smart watch 3000 including the energy harvester according to example embodiments.

Referring to FIG. 30, the smart watch 3000 may include an energy harvester 3010 which has been described with reference to FIGS. 1 through 29. FIG. 30 illustrates the energy harvester as it appears in FIG. 17, but it is not limited thereto. For example, the smart watch 3000 may include an energy harvester according to another example embodiment, which has been described with reference to FIGS. 1 through 29. The energy harvester 3010 may be embedded in a buckle 3012 of the smart watch 3000. This is only illustrative, and an embedded location may be changed. For example, the energy harvester 3010 may be embedded in a main body 3014 of the smart watch 3000. When the energy harvester 3010 is embedded in the smart watch 3000, a relative motion between first and second charging members may occur due to an inertial force caused by a motion of shaking an arm. Accordingly, electrical energy may be normally charged.

The electrical energy generated by the energy harvester 3010 may be delivered to other elements of the smart watch 3000. Examples of the other elements may include a charging battery, a sensor, and a display, but are not limited thereto. For example, a cable hole 3011 may be provided on the energy harvester 3010 such that electrical energy may be delivered to the other elements of the smart watch 3000 through a wire connected to the energy harvester 3010. For efficient energy delivery, the smart watch may include a transmission circuit configured to transmit electrical energy.

Figure 31:
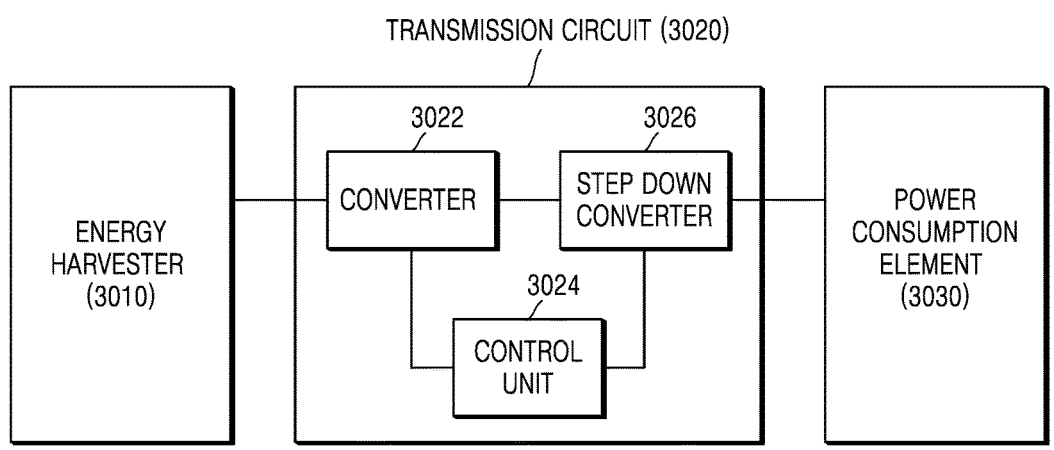
FIG. 31 is a block diagram of a transmission circuit which may be included in the smart watch.

FIG. 31 is a block diagram of a transmission circuit 3020 which may be included in the smart watch 3000. Referring to FIG. 31, the transmission circuit 3020 may include a converter 3022 configured to convert an electrical signal of an alternating current (AC) form into a direct current (DC). In addition, the transmission circuit 3020 may include a control unit 3024 configured to control an impedance of the transmission circuit 3020 such that a transmission rate of power delivered from the energy harvester 3010 to a power consumption element 3030 is maximized. The control unit 3024 may include a variable resistor and the like to control the impedance of the transmission circuit 3020. Accordingly, the impedance of the transmission circuit 3020 may be matched such that a transmission rate of electrical energy delivered to the power consumption element 3030 through the transmission circuit 3020 is maximized. The transmission circuit 3020 may include a step down converter 3026 configured to decrease a magnitude of a DC voltage converted by the converter 3022 when the magnitude is too large. The step down converter 3026 may function to protect other elements by suppressing excessive generation of an electrical signal.

The smart watch 3000 has been illustratively described as an example of a wearable device, but the present embodiment is not limited thereto. For example, the energy harvester may be included in a cellular phone, a radio receiver, a biosensor, a position sensor, a body temperature sensor, a blood pressure sensor, or the like and used as a power supply means. The energy harvester may be embedded in a mobile device worn on a normally moving part of a human body, such as an arm or a leg, to convert kinetic energy according to a motion of the arm or leg into electrical energy. Besides, the energy harvester may be equipped in a mechanical device to convert vibrations of the mechanical device into electrical energy. In addition, the energy harvester may generate electrical energy by using vibrations generated due to wind, pressure, sound, flow of a fluid, or the like.

While technical features have been described with reference to example embodiments, it will be understood by those of ordinary skill in the art that various changes and equivalent other embodiments may be made therefrom.

The invention claimed is:

1. An energy harvester comprising:
a first charging member comprising a plurality of first protruding parts; and
a second charging member comprising a plurality of second protruding parts arranged between the first protruding parts and comprising a material different from that of the first protruding parts,
wherein, when at least one of the first and second charging members moves, side surfaces of the first protruding parts and side surfaces of the second protruding parts come into contact with each other, or gaps between the side surfaces of the first protruding parts and the side surfaces of the second protruding parts are changed, thereby generating electrical energy,
wherein the second charging member comprises a second electrode including:
a plurality of first sub-electrodes arranged parallel to an arrangement direction of the first and second protruding parts and electrically connected to each other; and
a plurality of second sub-electrodes electrically isolated from the plurality of first sub-electrodes and arranged between the first sub-electrodes and electrically connected to each other,
wherein the second charging member further comprises a dielectric layer, and
wherein the second protruding parts are disposed on a first surface of the dielectric layer, and the second electrode is disposed on a second surface of the dielectric layer which is different from the first surface of the dielectric layer.

2. The energy harvester of claim 1, wherein the first and second protruding parts are formed in a first direction, and at least one of the first and second charging members moves in a second direction orthogonal to the first direction.

3. The energy harvester of claim 1, wherein the first charging member comprises a first electrode.

4. The energy harvester of claim 1, wherein the first charging member comprises:
a first plastic structure comprising a plurality of first posts having a shape corresponding to the first protruding parts; and
a first electrode on a surface of the first plastic structure.

5. The energy harvester of claim 1, wherein the dielectric layer comprises at least one of piezoelectric materials, ferroelectric materials, an electroactive polymer (EAP), or pyroelectric materials.

6. The energy harvester of claim 1, wherein the first charging member comprises:
a first electrode; and
a first dielectric layer on the first electrode.

7. The energy harvester of claim 1, further comprising a first guide member configured to guide at least one of the first and second charging members to move in a first direction.

* * * * *